(12) United States Patent
Coppens et al.

(10) Patent No.: US 8,648,410 B2
(45) Date of Patent: Feb. 11, 2014

(54) ELECTRONIC DEVICE INCLUDING A GATE ELECTRODE AND A GATE TAP

(71) Applicants: Peter Coppens, Kanegem (BE); Eddy De Backer, Merelbeke (BE); Freddy De Pestel, Lochristi (BE); Gordon M. Grivna, Mesa, AZ (US)

(72) Inventors: Peter Coppens, Kanegem (BE); Eddy De Backer, Merelbeke (BE); Freddy De Pestel, Lochristi (BE); Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/959,936

(22) Filed: Aug. 6, 2013

(65) Prior Publication Data

US 2013/0320428 A1    Dec. 5, 2013

Related U.S. Application Data

(62) Division of application No. 13/160,133, filed on Jun. 14, 2011, now Pat. No. 8,530,304.

(51) Int. Cl.
*H01L 29/66* (2006.01)

(52) U.S. Cl.
USPC ............................ 257/327; 257/E29.255

(58) Field of Classification Search
USPC .......................................... 257/E29.255, 327
See application file for complete search history.

(56) References Cited

U.S. PATENT DOCUMENTS

| | | | |
|---|---|---|---|
| 5,702,981 A * | 12/1997 | Maniar et al. | 438/627 |
| 5,811,350 A * | 9/1998 | Dennison | 438/597 |
| 6,015,751 A * | 1/2000 | Liu | 438/637 |
| 6,051,456 A | 4/2000 | Davies et al. | |
| 6,069,384 A | 5/2000 | Hause et al. | |
| 6,162,722 A * | 12/2000 | Hsu | 438/637 |
| 6,197,640 B1 | 3/2001 | Davies | |
| 6,232,223 B1 * | 5/2001 | Tran et al. | 438/637 |
| 6,277,726 B1 * | 8/2001 | Kitch et al. | 438/618 |
| 6,573,560 B2 | 6/2003 | Shenoy | |
| 6,713,831 B1 * | 3/2004 | Sadoughi et al. | 257/437 |
| 6,750,140 B2 * | 6/2004 | Hohnsdorf | 438/637 |
| 7,087,925 B2 | 8/2006 | Grivna | |
| 7,868,379 B2 | 1/2011 | Loechelt | |
| 7,902,017 B2 | 3/2011 | Loechelt | |
| 7,989,857 B2 | 8/2011 | Loechelt | |
| 8,076,716 B2 | 12/2011 | Loechelt | |
| 8,124,468 B2 | 2/2012 | Loechelt et al. | |
| 8,222,695 B2 | 7/2012 | Loechelt et al. | |
| 8,298,886 B2 | 10/2012 | Loechelt et al. | |
| 8,299,560 B2 | 10/2012 | Loechelt et al. | |
| 8,389,369 B2 | 3/2013 | Loechelt | |
| 2002/0149050 A1 * | 10/2002 | Fazio et al. | 257/314 |
| 2007/0155104 A1 | 7/2007 | Marchant et al. | |
| 2009/0140343 A1 | 6/2009 | Feilchenfeld et al. | |
| 2012/0228704 A1 | 9/2012 | Ju | |
| 2012/0319188 A1 | 12/2012 | Coppens et al. | |

* cited by examiner

*Primary Examiner* — Lex Malsawma
(74) *Attorney, Agent, or Firm* — Abel Law Group, LLP

(57) ABSTRACT

An electronic device can include a gate electrode and a gate tap that makes an unlanded contact to the gate electrode. The electronic device can further include a source region and a drain region that may include a drift region. In an embodiment, the gate electrode has a height that is greater than its width. In another embodiment, the electronic device can include gate taps that spaced apart from each other, wherein at least some of the gate taps contact the gate electrode over the channel region. In a further embodiment, at a location where the gate tap contacts the gate electrode, the gate tap is wider than the gate electrode. A variety of processes can be used to form the electronic device.

20 Claims, 28 Drawing Sheets

ELECTRONIC DEVICE INCLUDING A GATE ELECTRODE AND A GATE TAP

CROSS-REFERENCE TO RELATED APPLICATION

This is a divisional of and claims priority under 35 U.S.C. §120 to U.S. patent application Ser. No. 13/160,133 entitled "Electronic Device Including a Gate Electrode and a Gate Tap and a Process of Forming the Same" by Coppens et al. on Jun. 14, 2011, now allowed, which is assigned to the current assignee hereof and incorporated herein by reference in its entirety.

FIELD OF THE DISCLOSURE

The present disclosure relates to electronic devices and processes of forming electronic devices, and more particularly to, electronic devices including gate electrodes and gate taps and processes of forming the same.

RELATED ART

Metal-oxide semiconductor field effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

Many MOSFETs have landed contacts, meaning, from a top view, a contact or via makes direct contact to an underlying conductor at a location where the underlying conductor is widened to ensure a proper contact between the contact or via and the underlying conductor to allow for misalignment of the contact or via to the underlying conductor. Landed gate contacts are less likely to cause electrical shorts or leakage paths between the gate electrodes and source or drain regions, well regions, a substrate or contacts to any of the foregoing. An unlanded contact is typically used when the underlying conductor is a contact, a via, or an interconnect, or another conductive structure or member that is much higher in elevation as compared to the gate electrodes. Unlanded contacts to gate electrodes are avoided due to narrow widths of the gate electrodes and the likelihood of forming an electrical short or leakage path to a source region, a drain region, a well region, or substrate.

A very small fraction of MOSFETs have unlanded gate contacts, but such gate electrodes are wide enough so that design rules for contacts, such as contacts to the gate, source and drain regions are not violated. Accordingly, MOSFETs with unlanded gate contacts may have gate electrodes that are relatively wide and occupy a significantly more area than MOSFET with landed gate contacts.

BRIEF DESCRIPTION OF THE DRAWINGS

Embodiments are illustrated by way of example and are not limited in the accompanying figures.

Figure 1:
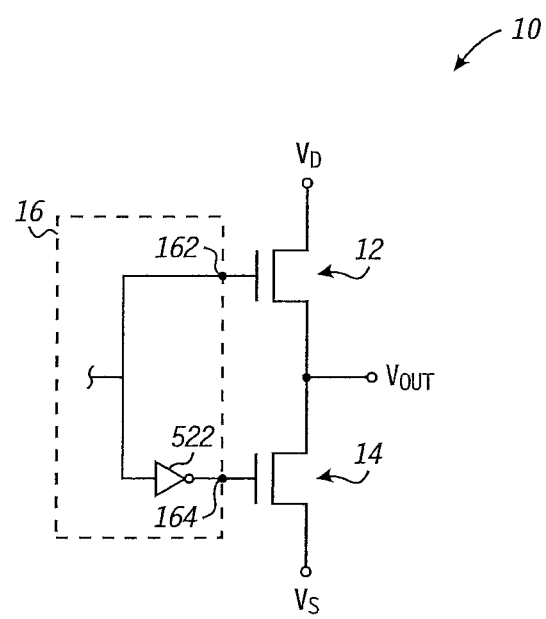
FIG. 1 includes a circuit diagram of a portion of an electronic device.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

As used herein, the terms "horizontally-oriented" and "vertically-oriented," with respect to a region or structure, refers to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "landed contact" is intended to mean a contact or a via to an underlying conductive structure, wherein a portion of the underlying conductive structure is wider at a location for a purpose of increasing a likelihood of that the underlying conductive structure underlies all of the contact or via, as compared to the width of another portion the underlying conductor near the wider portion of the underlying conductor. An "unlanded contact" is a contact that is not a landed contact.

The terms "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor is designed to normally operate at least a 10 V difference to be maintained between the source and drain or emitter and collector of the transistor. For example, when the transistor is in an off-state, a 10 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the *CRC Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a transistor structure that has a gate tap and a gate runner. The gate tap can be in the form of an unlanded contact to a gate electrode of the transistor structure. The gate runner may be part of the same conductive structure and can be used to electrically connect the gate tap to another part of the electronic device. In an embodiment, a plurality of gate taps can be spaced apart from each other and electrically connected to the same gate electrode, and the gate runner can electrically connect the gate taps to each other. In another embodiment, a gate tap may directly overlie a channel region of the transistor structure. In a particular embodiment, an electrical short or leakage path between the gate tap and another portion of the transistor structure, such as a source region, drain region, well region or substrate, may be less likely when the gate electrode has a height that is greater than its width.

In power transistors, the physical design of the gate taps and gate runners affect the parasitic resistance (in providing a gate signal along a span of the gate electrode) and parasitic resistance (gate-to-source, gate-to-drain, etc.) of the electronic device. Many different arrangements for the gate taps and gate runners allow different parasitic resistances and different parasitic capacitances to be achieved. Thus, a circuit design can tune the electronic device for a particular parasitic resistance and parasitic capacitance by adjusting the physical design of the gate taps and gate runners.

In the description that follows, concepts will be described with respect to embodiments in which the electronic device can include a high-frequency voltage regulator, wherein the high-frequency voltage regulator includes transistor structures that are parts of a high-side power transistor and other transistors that are parts of a low-side power transistor. In embodiments, the concepts described herein can be particularly useful for designs in which substantial portions of gate lines are routed over electrically active portions of electronic devices, as compared to designs in which substantial portions of gate lines are routed over field isolation regions. Clearly, the concepts described herein are not limited to high-frequency voltage regulators or power transistors. After reading the specification, skilled artisans will appreciate that the concepts described herein may be adapted to many different electronic devices and different transistor structures.

FIG. 1 includes a circuit diagram of a portion of an electronic device 10. In the embodiment as illustrated in FIG. 1, the electronic device 10 can include a power switching circuit. The electronic device 10 includes a transistor 12, wherein a drain region of the transistor 12 is coupled to a terminal, such as $V_D$, and a source region of the transistor 12 is coupled to a terminal, such as $V_{OUT}$. The electronic device 10 also includes a transistor 14, wherein a drain region of the transistor 14 is coupled to the source of the transistor 12, and a source region of the transistor 14 is coupled to a terminal, such as $V_S$. The gate electrodes of the transistors 12 and 14 can be coupled to control terminals 162 and 164 of a control unit 16. In a particular embodiment, the control unit 16 can be configured such that only one of the transistors 12 and 14 is enabled at any particular point in time. When the transistor 12 is enabled (and the transistor 14 is disabled), $V_{OUT}$ will be substantially $V_D$, and when the transistor 14 is enabled (and the transistor 12 is disabled), $V_{OUT}$ will be substantially $V_S$. The control unit 16 can be used to determine when and how frequently $V_{OUT}$ will be switched from $V_S$ to $V_D$, and vice versa. In a more particular embodiment, the transistors 12 and 14 can be power switching transistors within a high-frequency voltage regulator.

Physical structures corresponding to the transistors 12 and 14 and processes of forming such physical structures are described below. In the description below, the transistor 12 can be referred to as the high-side power transistor, and the transistor 14 can be referred to as the low-side power transistor. In a particular embodiment, the control unit 16 is on the same integrated circuit as the transistors 12 and 14.

Figure 2:
FIG. 2 includes an illustration of a cross-sectional view of a portion of a workpiece that includes a buried conductive region.
Figure 2:
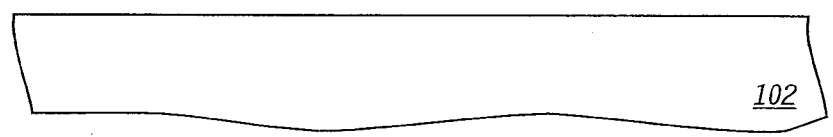

FIG. 2 includes an illustration of a cross-sectional view of a portion of a workpiece 100 that includes a buried conductive region 102. The buried conductive region 102 can include a Group 14 element (i.e., carbon, silicon, germanium, or any combination thereof) and can be heavily n-type or p-type doped. For the purposes of this specification, heavily doped is intended to mean a peak dopant concentration of at least $10^{19}$ atoms/cm$^3$, and lightly doped is intended to mean a peak dopant concentration of less than $10^{19}$ atoms/cm$^3$. The buried conductive region 102 can be a portion of a heavily doped substrate (e.g., a heavily n-type doped wafer) or may be a buried doped region overlying a substrate of opposite conductivity type or overlying a buried insulating layer (not illustrated) that lies between a substrate and the buried conductive region 102. In an embodiment, the buried conductive region 102 is heavily doped with an n-type dopant, such as phosphorus, arsenic, antimony, or any combination thereof. In a particular embodiment, the buried conductive region 102 includes arsenic or antimony if diffusion of the buried conductive region 102 is to be kept low, and in a particular embodiment, the buried conductive region 102 includes antimony to reduce the level of autodoping (as compared to arsenic) during formation of a subsequently-formed semiconductor layer. The buried conductive region 102 will be used to electrically connect the source of the high-side power transistor and the drain of the low-side power transistor together and be part of an output node for the electronic device.

Figure 3:
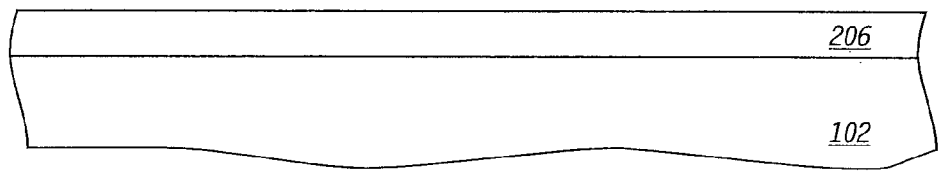
FIG. 3 includes an illustration of a cross-sectional view of the workpiece of FIG. 2 after forming a buried doped region for a high-side power transistor.
Figure 3:
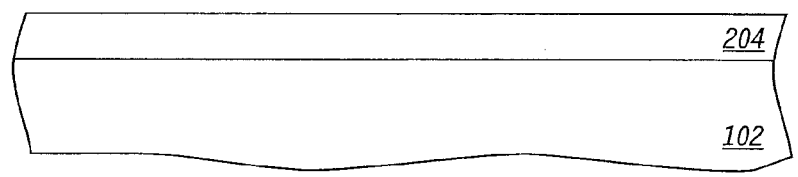

Referring to FIG. 3, a semiconductor layer 204 is formed over the buried conductive region 102. The semiconductor layer 204 can include a Group 14 element (i.e., carbon, silicon, germanium, or any combination thereof) and any of the dopants as described with respect to the buried conductive region 102 or dopants of the opposite conductivity type. In an embodiment, the semiconductor layer 204 is a lightly doped n-type or p-type epitaxial silicon layer having a thickness in a range of approximately 0.2 microns to approximately 2.0 micron, and a doping concentration no greater than approximately $10^{17}$ atoms/cm$^3$, and in another embodiment, a doping concentration of at least approximately $10^{14}$ atoms/cm$^3$. The semiconductor layer 204 is formed over all of the workpiece 100.

A portion of the semiconductor layer 204 within the high-side power transistor is heavily doped with a dopant of opposite conductivity type as compared to the buried conductive region 102 to form a buried doped region 206. The buried doped region 206 can help with isolation within the high-side power transistor and reduce parasitic characteristics of the high-side power transistor. In a particular embodiment, the buried doped region 206 has a peak dopant concentration of at least approximately $10^{18}$ atoms/cm$^3$ of a p-type dopant.

Figure 4:
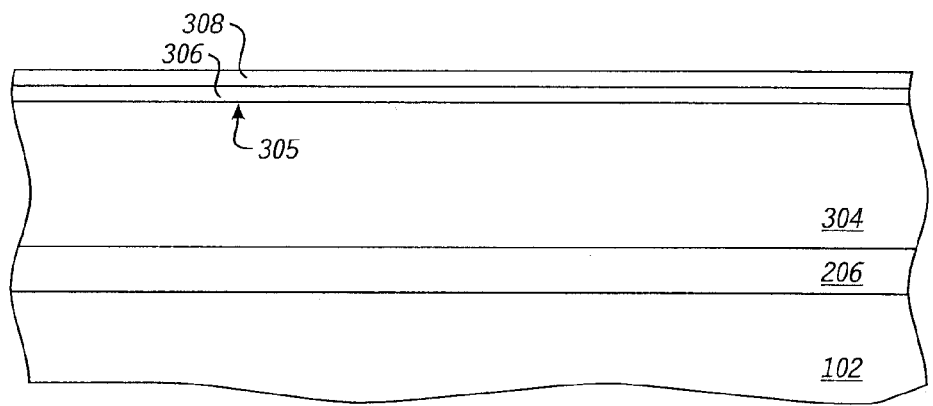
FIG. 4 includes an illustration of a cross-sectional view of the workpiece of FIG. 3 after forming a semiconductor layer, a pad layer, and a stopping layer.
Figure 4:
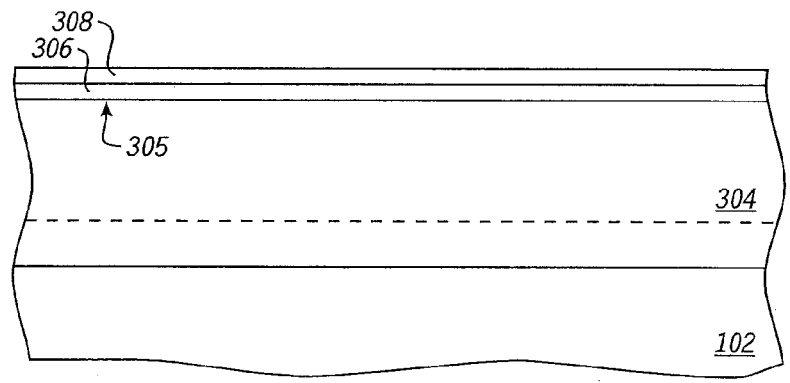

Referring to FIG. 4, a semiconductor layer 304 is formed over the semiconductor layer 204 (not labeled in FIG. 4) and buried doped region 206. In a particular embodiment, the semiconductor layers 204 and 304 have the same conductivity type and both are lightly doped. Thus, the dashed line within the illustration of the low-side power transistor in FIG. 4, illustrates an approximate location where the semiconductor layer 204 ends and the semiconductor layer 304 starts. The semiconductor layer 304 has a primary surface 305. The semiconductor layer 304 can include a Group 14 element (i.e., carbon, silicon, germanium, or any combination thereof) and any of the dopants as described with respect to the buried conductive region 102 or dopants of the opposite conductivity type. In an embodiment, the semiconductor layer 304 is a lightly doped n-type or p-type epitaxial silicon layer having a thickness in a range of approximately 0.5 microns to approximately 5.0 microns, and a doping concentration no greater than approximately $10^{17}$ atoms/cm$^3$, and in another embodiment, a doping concentration of at least approximately $10^{14}$ atoms/cm$^3$. The dopant concentration within the semiconductor layer 304 as formed or before selectively doping regions within the semiconductor layer 304 will be referred to as the background dopant concentration. In subsequent illustrations of the low-side power transistor, the combination of the semiconductor layers 204 and 304 will be referred to as the semiconductor layer 304 and will not include a dashed line.

A pad layer 306 and a stopping layer 308 (e.g., a polish-stop layer or an etch-stop layer) are sequentially formed over the semiconductor layer 304 using a thermal growth technique, a deposition technique, or a combination thereof. Each of the pad layer 306 and the stopping layer 308 can include an oxide, a nitride, an oxynitride, or any combination thereof. In an embodiment, the pad layer 306 has a different composition as compared to the stopping layer 308. In a particular embodiment, the pad layer 306 includes an oxide, and the stopping layer 308 includes a nitride.

Figure 5:
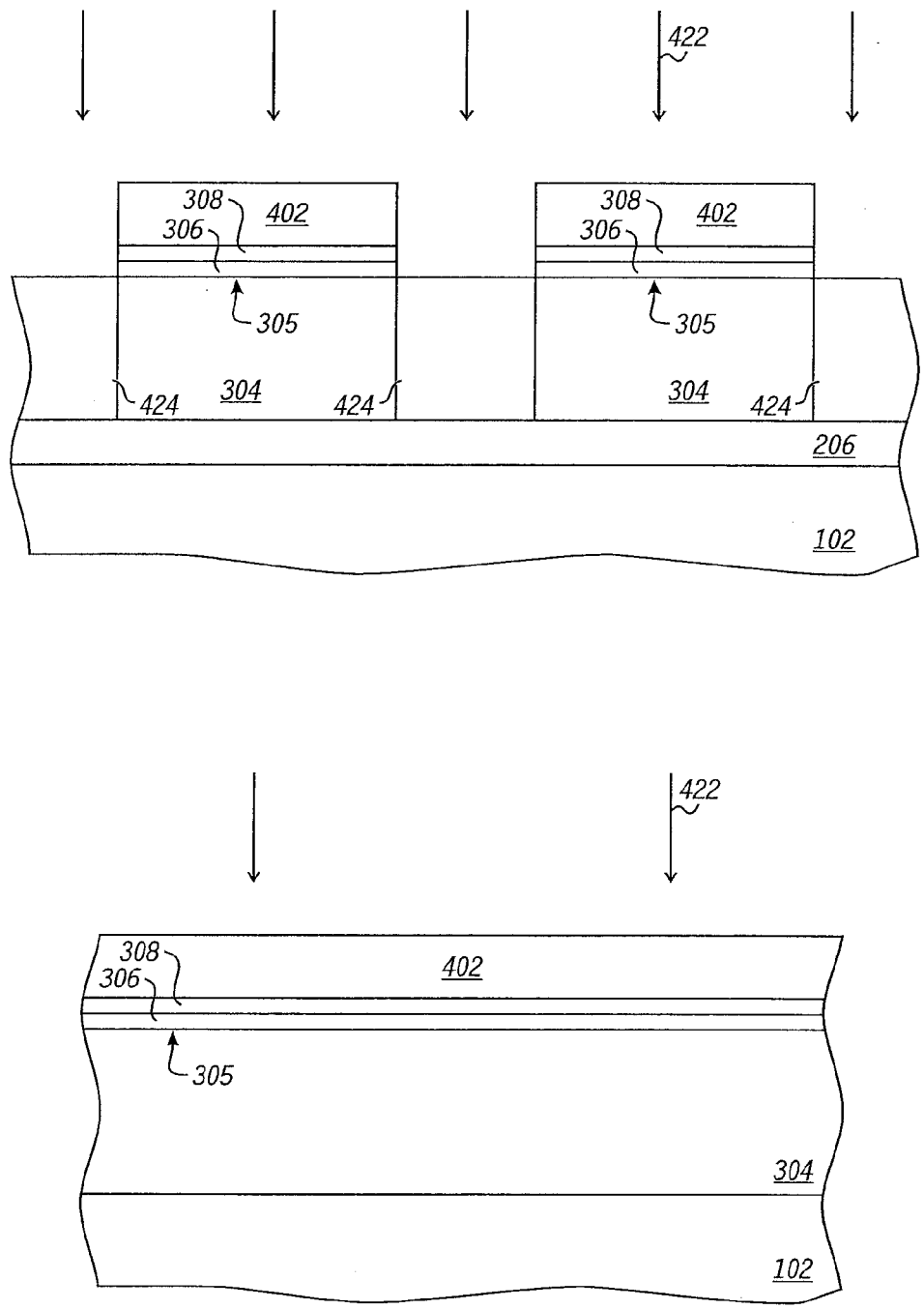
FIG. 5 includes an illustration of a cross-sectional view of the workpiece of FIG. 4 after patterning portions of the pad and stopping layers and forming vertical isolation regions.

Referring to FIG. 5, a patterned masking layer 402 is formed over the stopping layer 308. Openings within the patterned masking layer 402 are formed where vertical isolation regions will be formed. The vertical isolation regions are formed where the high-side power transistor is being formed. Thus, the patterned masking layer 402 covers substantially all of the stopping layer 308 where transistor structures of the low-side power transistor is being formed. In a particular embodiment, exposed portions of the pad layer 306 and stopping layer 308 are removed to expose portions of the semiconductor layer 304. In another embodiment (not illustrated), exposed portions pad layer 306 or both the pad layer 306 and stopping layer 308 are not etched. The presence of the pad layer 306 or both the pad layer 306 and stopping layer 308 may help to reduce implant channeling during a subsequent implant.

Portions of the semiconductor layer 304 under the openings in the patterned masking layer 402 are implanted (as illustrated by arrows 422) to form vertical isolation regions 424. The implantation may be performed as a single implant or as a plurality of implants. When a plurality of implants is performed, different energies, different species, or different energies and species may be used to form the vertical isolation regions 424. The conductivity type of the vertical isolation regions 424 can be the same as the buried doped region 206 and opposite that of the buried conductive region 102. In a particular embodiment, the vertical isolation regions 424 are p-type and have a dopant concentration of at least approximately $10^{18}$ atoms/cm$^3$. The combination of the vertical isolation regions 424 and buried doped region 206 help to isolate the portions of the semiconductor layer 304 within the high-side power transistor. After the implant, the patterned masking layer 402 is removed. In another embodiment described later in this specification, the vertical isolation regions can be formed using other techniques.

Another patterned masking layer (not illustrated) is formed over locations where the pad layer 306 and the stopping layer 308 are to be removed and trenches subsequently formed. At this point in the process, the pad layer 306 and stopping layer 308 are patterned within the low-side power transistor. If the pad layer 306 or both the pad layer 306 and stopping layer 308 have not been patterned within the high-side power transistor, the pad layer 306 or both the pad layer and stopping layer 308 within the high-side power transistor can be patterned with the corresponding portions within the low-side power transistor. After the pad layer 306 and stopping layer 308 have been patterned within the low-side power transistor (and possibly the high-side power transistor), the other patterned masking layer is removed.

Figure 6:
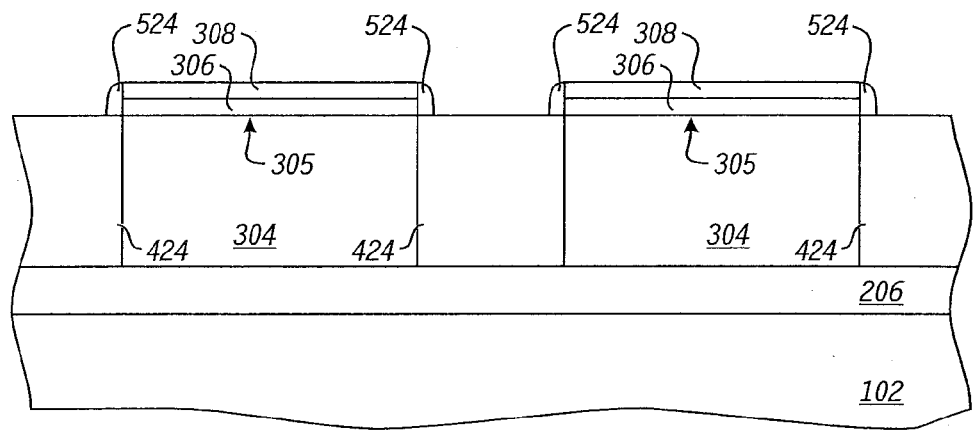
FIG. 6 includes an illustration of a cross-sectional view of the workpiece of FIG. 5 after patterning other portions of the pad and stopping layers and forming sidewall spacers.
Figure 6:
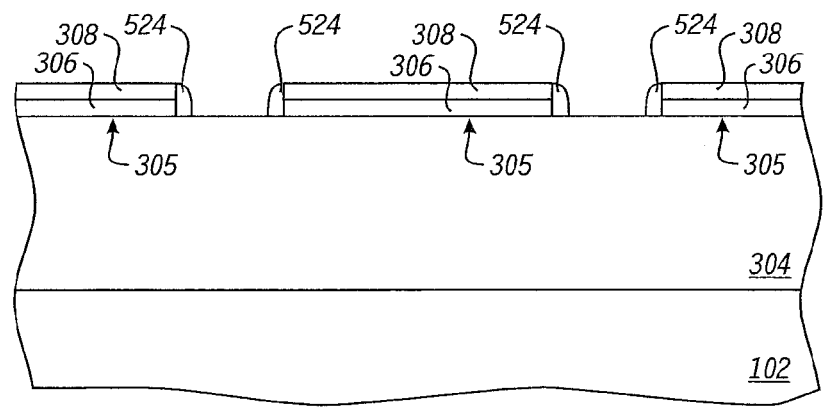

Sidewall spacers 524 are formed as illustrated in FIG. 6. The sidewall spacers 524 can be used to determine the widths of the subsequently-formed trenches and remaining portions of the vertical isolation regions 424 lying along sidewalls of the subsequently-formed trenches. The sidewall spacers 524 can be formed by depositing a sacrificial layer and anisotropically etching that layer. In a particular embodiment, the sacrificial layer can include an oxide, a nitride, an oxynitride, or any combination thereof. In a more particular embodiment, the sacrificial layer and the stopping layer 308 have different compositions. The thickness of the sacrificial layer may be no greater than approximately 900 nm or approximately 700 nm, or may be at least approximately 50 nm or approximately 100 nm.

Figure 7:
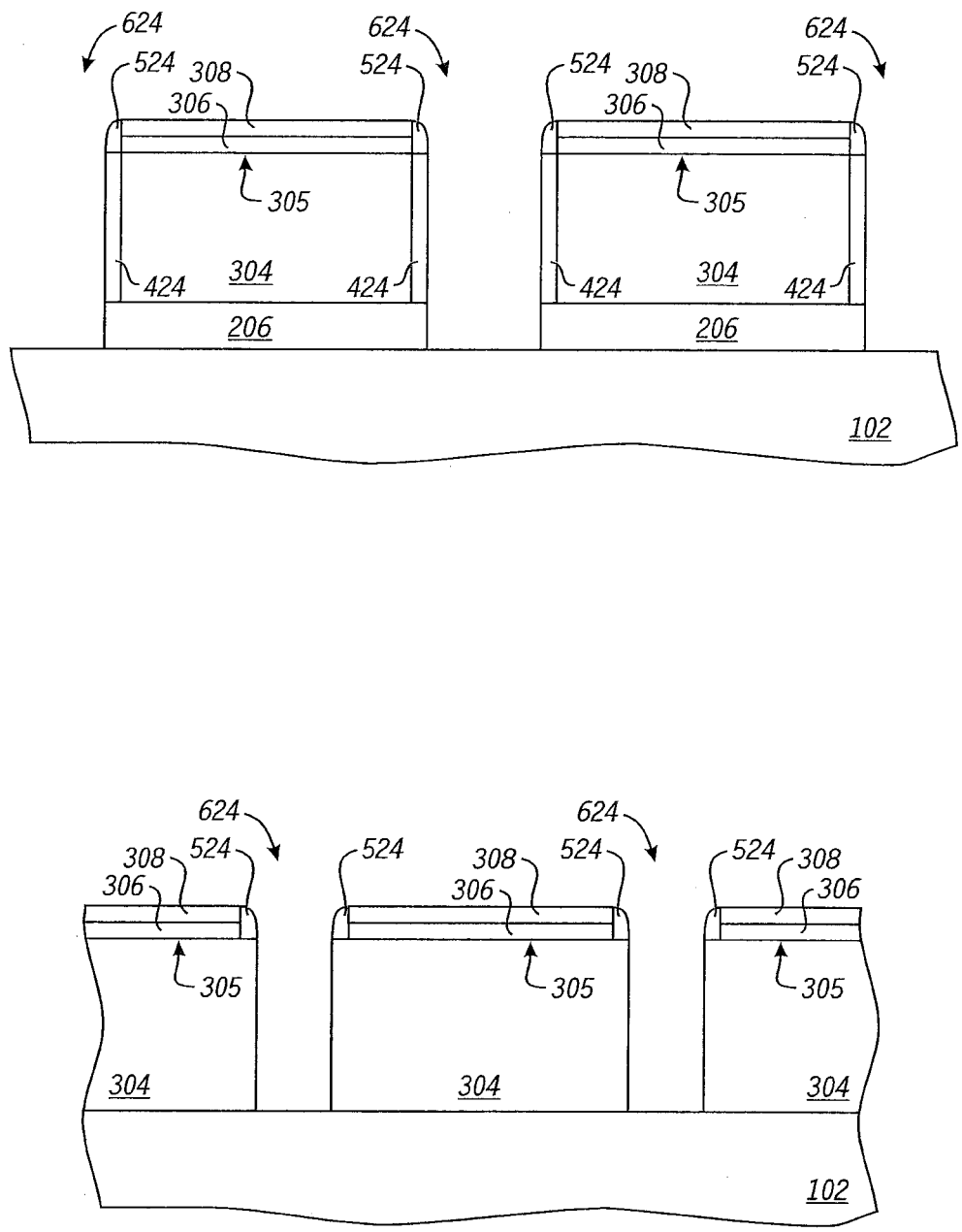
FIG. 7 includes an illustration of a cross-sectional view of the workpiece of FIG. 6 after forming trenches extending through a semiconductor layer toward the buried conductive region.

Exposed portions of the semiconductor layer 304 and, within the high-side power transistor, portions of the vertical isolation regions 424 and the buried doped regions 206 are etched to form trenches 624 that extend from the primary surface 305 toward the buried conductive region 102, as illustrated in FIG. 7. The trenches 624 may extend partly or completely through the semiconductor layer 304 or buried doped region 206. The widths of the trenches 624 are not so wide that a subsequently-formed conductive layer is incapable of filling the trenches 624. In a particular embodiment, the widths of each trenches 624 is at least approximately 0.3 micron or approximately 0.5 micron, and in another particular embodiment, the width of each trenches 624 is no greater than approximately 4 microns or approximately 2 microns. After reading this specification, skilled artisans will appreciate that narrower or wider widths outside the particular dimensions described may be used. The trenches 624 can extend to the buried conductive region 102; however, the trenches 624 may be shallower if needed or desired. The trenches 624 are formed using an anisotropic etch. In an embodiment, a timed etch can be performed, and in another embodiment, a combination of endpoint detection (e.g., detecting the dopant species from the buried conductive region 102, such as arsenic or antimony) and a timed overetch may be used.

Figure 8:
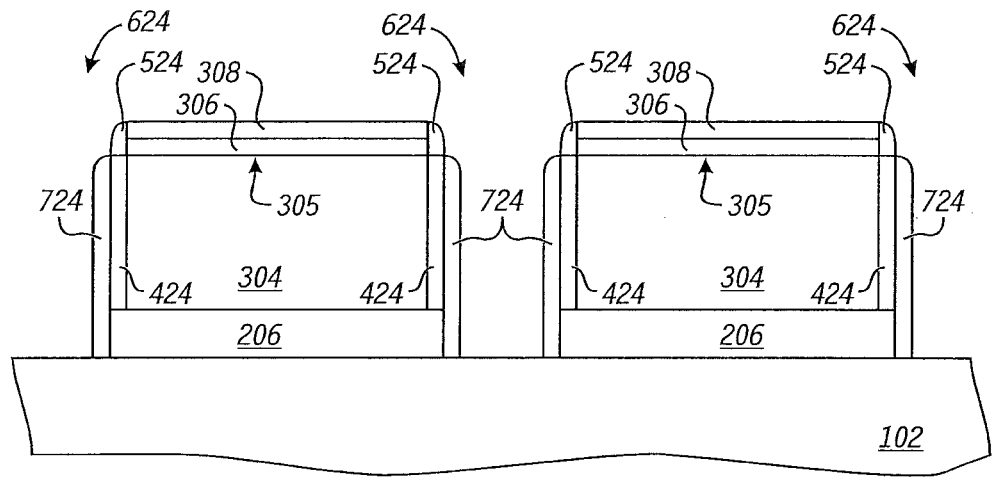
FIG. 8 includes an illustration of a cross-sectional view of the workpiece of FIG. 7 after forming insulating spacers within the trenches.
Figure 8:
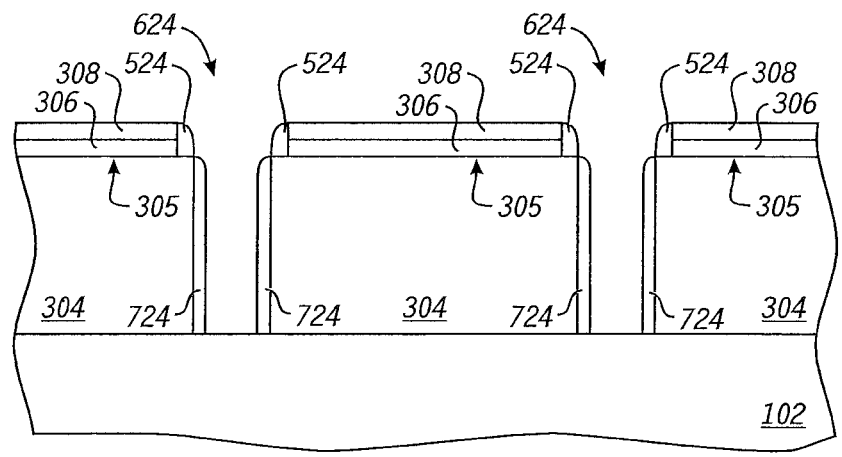

Insulating sidewall spacers 724 can be formed along the exposed sidewalls of the trenches 624, as illustrated in FIG. 8. The insulating sidewall spacers 724 can include an oxide, a nitride, an oxynitride, or any combination thereof. The layer from which the insulating sidewall spacers 724 are formed can be thermally grown or deposited, and the layer can be anisotropically etched to remove the layer from the bottoms of the trenches 624. If needed or desired, an etch can be performed to extend the trenches 624 closer to or further into the buried conductive region 102. In another embodiment, the insulating sidewall spacers 724 are not needed or are not formed within all trenches within the high-side or low-side power transistors. In a particular embodiment, the insulating sidewall spacers 724 may only be used within the trenches 624 of the low-side power transistor, and not used within the trenches 624 of the high-side power transistor. In another particular embodiment, the insulating sidewall spacers 724 may only be used within the trenches 624 of the high-side power transistor, and not used within the trenches 624 of the low-side power transistor.

A conductive layer is formed over the stopping layer 308 and within the trenches 624, and, in a particular embodiment, the conductive layer substantially fills the trenches 624. The conductive layer can be polycrystalline and include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, tungsten, or the like; the barrier film can include a refractory metal nitride, such as titanium nitride, tantalum nitride, tungsten nitride, or the like, or a refractory metal-semiconductor-nitride, such as TaSiN; and the conductive fill material can include tungsten or tungsten silicide. In a more particular embodiment, the conductive layer can include Ti/TiN/WSi. The selection of the number of films and composition(s) of those film(s) depends on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

Figure 9:
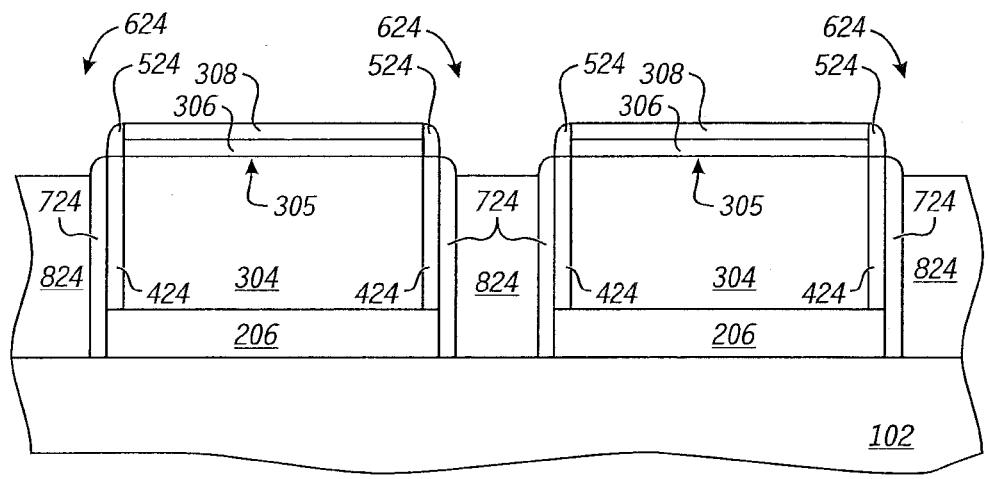
FIG. 9 includes an illustration of a cross-sectional view of the workpiece of FIG. 8 after forming recessed conductive structures within the trenches.
Figure 9:
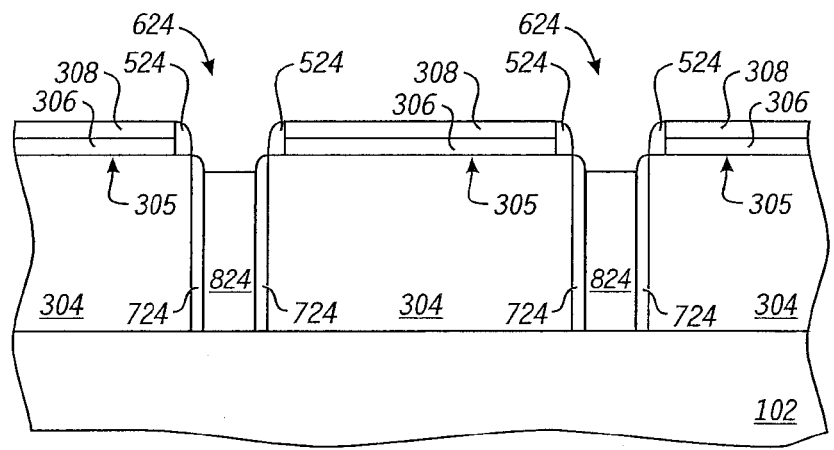

A portion of the conductive layer that overlies the stopping layer 308 is removed to form conductive structures 824 within the trenches 624, as illustrated in the embodiment of FIG. 9. The removal can be performed using a chemical-mechanical polishing or blanket etching technique. The stopping layer 308 may be used as a polish-stop or etch-stop layer. Polishing or etching may be continued for a relatively short time after the stopping layer 308 is reached to account for a non-uniformity across the workpiece with respect to the thickness of the conductive layer, non-uniformity of the polishing or etching operation, or any combination thereof. A continued etch or other removal operation can be used to recess the conductive structures 824 further into the trenches 624, as illustrated in FIG. 9, if needed or desired. The recessed conductive structures 824 may allow the vertical isolation regions 724 and conductive structures 824 to be electrically connected to one another more readily. The conductive structures 824 form vertically conductive regions. When in the form of a finished electronic device, the combination of conductive structures 824 and buried conductive region 102 electrically connects the source of the high-side power transistor to the drain of the low-side power transistor.

Figure 10:
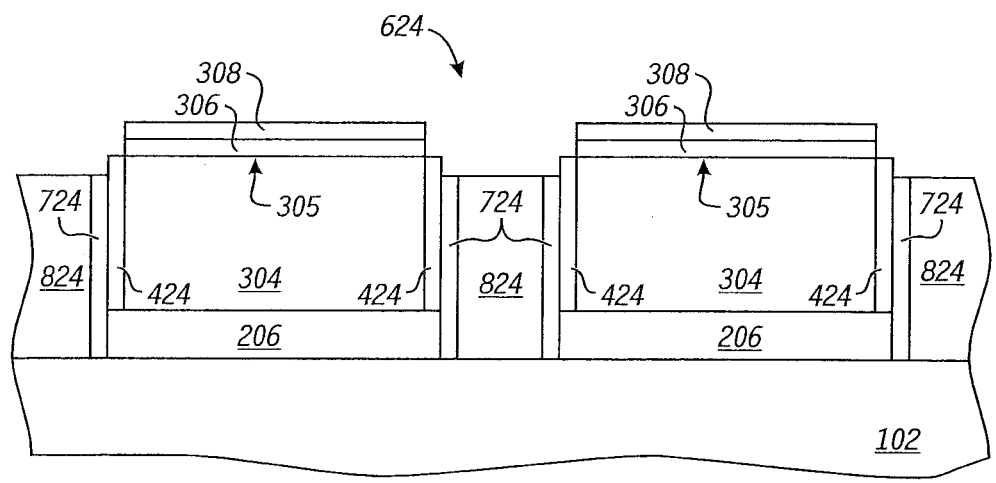
FIG. 10 includes an illustration of a cross-sectional view of the workpiece of FIG. 9 after removing sidewall spacers adjacent to the pad and stopping layers and after removing portions of the insulating spacers lying at elevations above the conductive structures.
Figure 10:
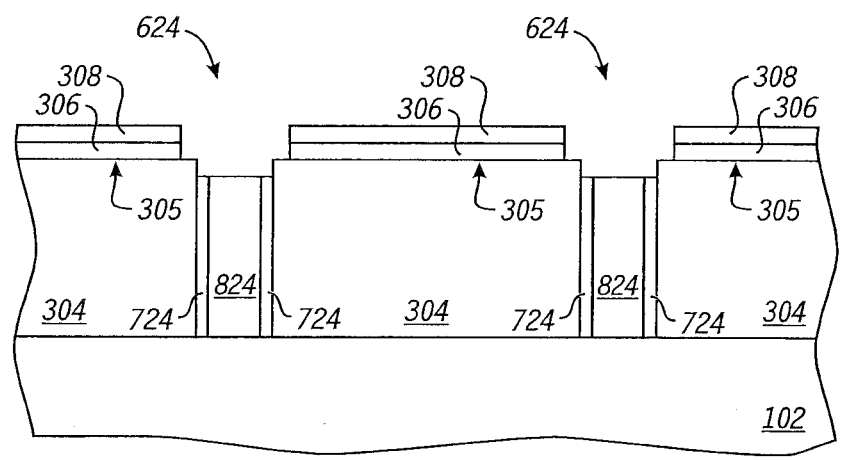

The sidewall spacers 524 and exposed portions of the insulating sidewall spacers 724 within the trenches 624 are removed, as illustrated in FIG. 10. The removal can be performed using an isotropic etching technique using a wet or dry etchant. In a particular embodiment, the sidewall spacers 524 and the insulating sidewall spacers 724 include an oxide, and the stopping layer 308 includes a nitride, and therefore, the sidewall spacers 524 and the insulating sidewall spacers 724 can be selectively removed without removing a substantial amount of the stopping layer 308. At this point in the process, portions of the semiconductor layer 304, the vertical isolation regions 724, and the conductive structures 824 are exposed.

In another embodiment (not illustrated), within the low-side power transistor, portions of the semiconductor layer 304 near the trenches 624 may be doped to form part of the drain regions of transistors structures of the low-side power transistor. A mask may be formed over the high-side power transistor to reduce the likelihood of counter doping the vertical isolation regions 424 within the high-side power transistor. After portions of the semiconductor layer 304 are doped, the mask is removed. An optional oxidation operation can be performed to help round the upper corners of the semiconductor layer 304.

Figure 11:
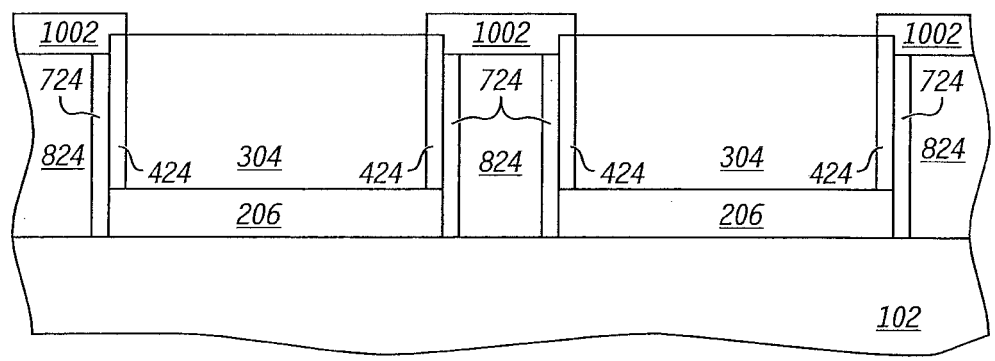
FIG. 11 includes an illustration of a cross-sectional view of the workpiece of FIG. 10 after forming conductive plugs and removing remaining portions of the pad and stopping layers.
Figure 11:
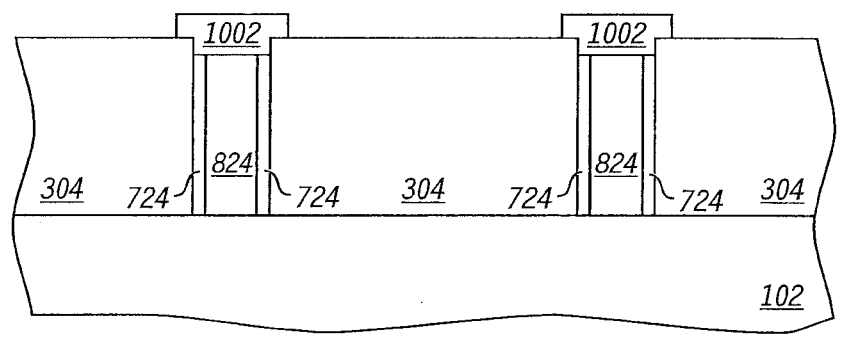

In FIG. 11, conductive plugs 1002 are formed to electrically connect the conductive structures 824 to the vertical isolation regions 424 and the semiconductor layer 304 or doped regions within the semiconductor layer 304. The conductive plugs 1002 can be formed using any of the materials and methods of formation for the conductive structures 824, except that the conductive plugs 1002 are not recessed within the trenches 624. The conductive plugs 1002 and conductive structures 824 may include the same material or different materials and may be formed using the same technique or different techniques. The pad layer 306 and the stopping layer 308 may be removed at this point in the process.

Figure 12:
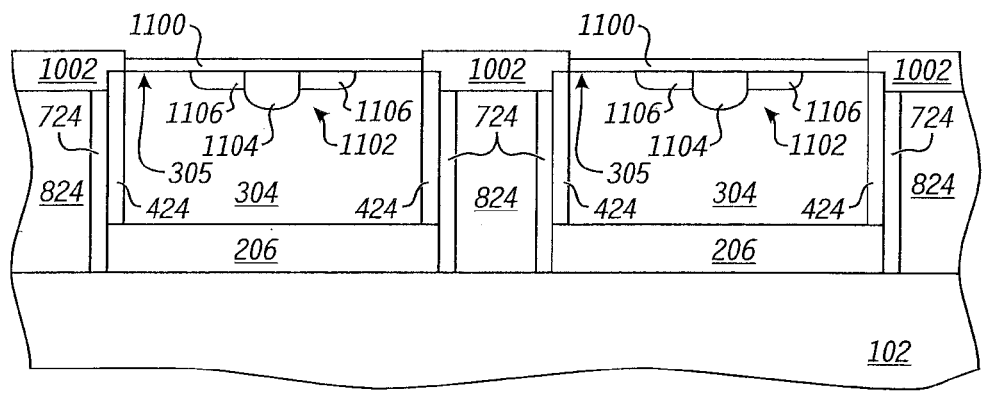
FIG. 12 includes an illustration of a cross-sectional view of the workpiece of FIG. 11 after forming an implant screen layer and drain regions.
Figure 12:
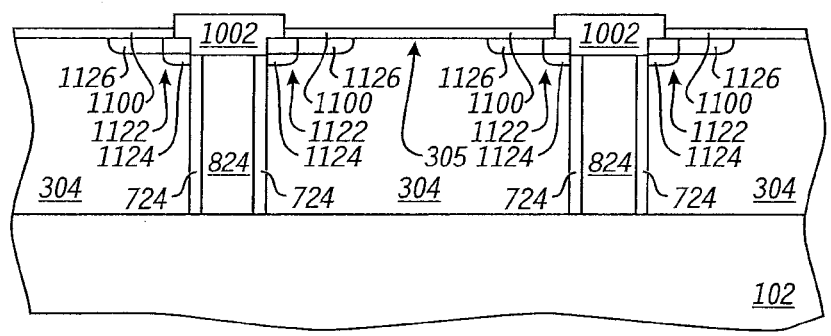

An implant screen layer 1100 is formed over the primary surface 305, as illustrated in FIG. 12. The implant screen layer 1100 can include an oxide, a nitride, or an oxynitride and may have a thickness in a range of approximately 2 nm to approximately 50 nm. The implant screen layer 1100 can be formed by a thermal growth or deposition technique.

Drain regions 1102 and 1122 of transistor structures of the high-side and low-side transistors, respectively, are formed within the semiconductor layer 304. Each of the drain regions 1102 includes a relatively higher dopant concentration and deeper portion 1104 and a relatively lighter dopant concentration and shallower potion 1106, and each of the drain regions 1122 includes a relatively higher dopant concentration and deeper portion 1124 and a relatively lighter dopant concentration and shallower potion 1126. In another embodiment, the deeper portion 1124 of the drain region 1122 may be omitted from transistor structures of the low-side power transistor.

The portions 1104 and 1124 are highly conductive and are designed to be at a high voltage, and the portions 1106 and 1126 are somewhat more resistive and reduce the voltage near the subsequently-formed gate dielectric layer and gate electrodes. Under normal operating conditions in which a high voltage is applied to the drain of a power transistor, most or all of regions 1106 and 1126 will be depleted of carriers, and most or all of regions 1104 and 1124 will be undepleted of carriers. In a particular non-limiting embodiment, the portions 1106 and 1126 are horizontally-oriented doped regions that are spaced apart from the buried conductive region 102. In a normal operating state, the principal charge carrier (electrons) or current flow through the portions 1106 and 1126 will be in horizontal direction.

The portions 1104 and 1124 can include dopant type opposite that of the vertical isolation regions 424 and have a dopant concentration of at least approximately $10^{19}$ atoms/cm$^3$, and the portions 1106 and 1126 may include dopant type opposite that of the vertical isolation regions 424 and have a dopant concentration of less than approximately $10^{19}$ atoms/cm$^3$ and at least approximately $10^{16}$ atoms/cm$^3$. The portions 1106 and 1126 have depths in a range of approximately 0.1 micron to approximately 0.5 microns, and extend laterally from the portions 1104 and 1124 in a range of approximately 0.2 micron to approximately 2.0 microns. The lateral dimension (from either the vertically-oriented conductive structure or the more heavily doped portions 1104 and 1124) can depend on the voltage difference between the sources and drains of the transistor structures being formed. As the voltage difference increases, the lateral dimension can also increase. In an embodiment, the voltage difference is no greater than approximately 30 V, and in another embodiment, the voltage difference is no greater than approximately 20 V. The peak doping concentration within the portions 1106 and 1126 can be in a range of approximately $2 \times 10^{17}$ atoms/cm$^3$ to approximately $2 \times 10^{18}$ atoms/cm$^3$, and in a particular embodiment, in a range of approximately $4 \times 10^{17}$ atoms/cm$^3$ to approximately $7 \times 10^{17}$ atoms/cm$^3$.

In a particular embodiment, the portions 1104 and 1124 are formed using the same masking layer and the same implant species and other implant parameters compared to each other, and the portions 1106 and 1126 are formed using the same masking layer and the same implant species and other implant parameters compared to each other; however, the masking layers and implant species and parameters are different for portions 1104 and 1124 as compared to the portions 1106 and 1126. In subsequent figures, the drain regions 1102 and 1122 are illustrated without differentiating the different portions.

In an alternate embodiment, portions 1106 and 1126 can extend continuously across the length of the unit cell of the transistor structure (i.e., extend to regions where channel and source regions will be subsequently formed). The doping of the channel region, to be described later, is commensurately increased to counter-dope the portion of the drain region within the channel region. In a further embodiment, this masking layer can be eliminated, allowing the implant that forms regions 1106 and 1126 to be continuous across the entire workpiece.

Figure 13:
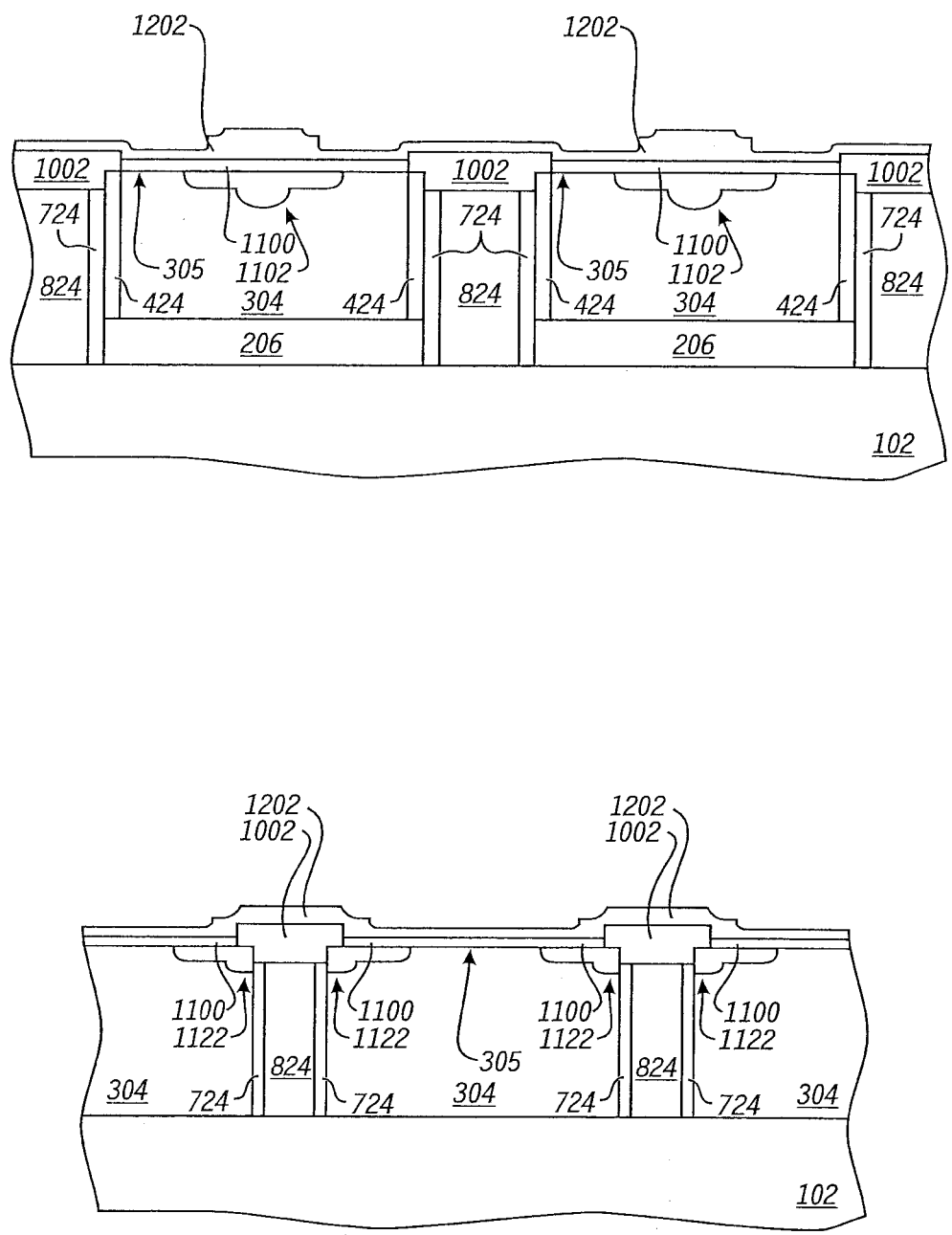
FIG. 13 includes an illustration of a cross-sectional view of the workpiece of FIG. 12 after forming an insulating layer.

An insulating layer 1202 is formed over the conductive plugs 1002 and the implant screen layer 1100, as illustrated in FIG. 13. The insulating layer 1202 includes at least two different types of regions having different thicknesses. In effect, the insulating layer 1202 has a terraced configuration. In the embodiment as illustrated in FIG. 13, the insulating layer 1202 includes three regions each having a different thickness. The thinnest regions overlie the more lightly doped portions (i.e., portions 1106 and 1126 in FIG. 12) of the drain regions 1102 and 1122 and over portions of the semiconductor layer 304 near the primary surface 305 and outside of the drain regions 1102 and 1122. The thickest regions overlie the more heavily doped portions (i.e., portions 1104 and 1124) of the drain regions 1102 and 1122. Intermediate regions may lie between the thinner and thickest regions and are optional.

In an embodiment, the insulating layer 1202 within the thinnest regions have a thickness of at least approximately 0.02 microns or at least approximately 0.05 microns, and in another embodiment, the insulating layer 1202 within the thinnest regions have a thickness no greater than approximately 0.2 microns or no greater than approximately 0.1 microns. In an embodiment, the insulating layer 1202 within the thickest regions have a thickness of at least approximately 0.15 microns or at least approximately 0.25 microns, and in another embodiment, the insulating layer 1202 within the thickest regions have a thickness no greater than approximately 0.8 microns or no greater than approximately 0.5 microns. The intermediate regions (between the thinner and thickest regions) may have a thickness substantially the same as the thinnest region or the thickest region or a thickness in between that of the thinner and thickest regions. In an embodiment, the insulating layer 1202 within the intermediate regions have a thickness of at least approximately 0.05 microns or at least approximately 0.15 microns, and in another embodiment, the insulating layer 1202 within the intermediate regions have a thickness no greater than approximately 0.5 microns or no greater than approximately 0.25 microns. In a particular embodiment, the insulating layer 1202 within the thinnest regions have a thickness in a range of approximately 0.03 microns to approximately 0.08 microns, the insulating layer 1202 within the thickest regions have a thickness in a range of approximately 0.3 microns to approximately 0.5 microns, and the insulating layer 1202 within the intermediate regions have a thickness in a range of approximately 0.13 microns to approximately 0.2 microns.

Figure 14:
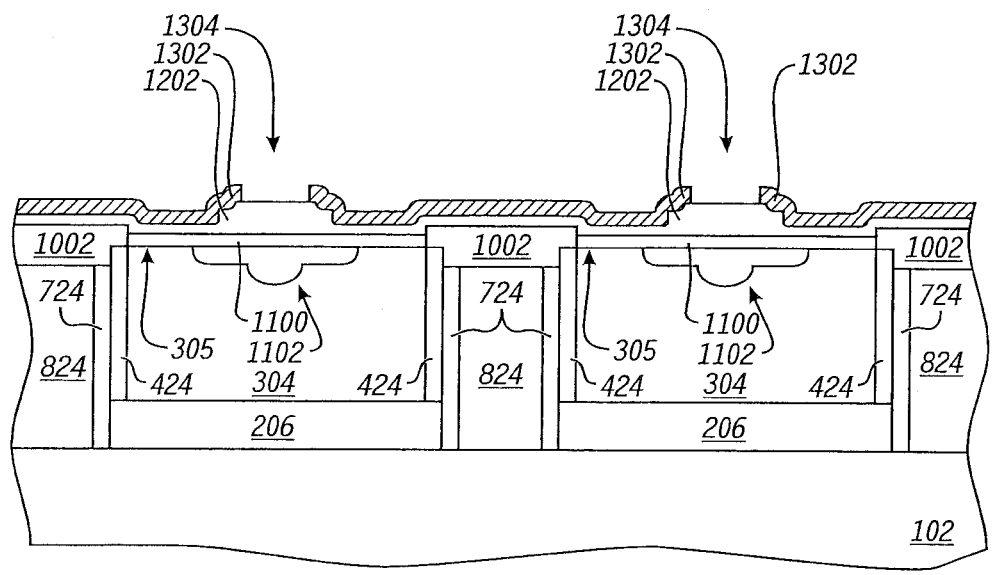
FIG. 14 includes an illustration of a cross-sectional view of the workpiece of FIG. 13 after forming a patterned conductive layer.
Figure 14:
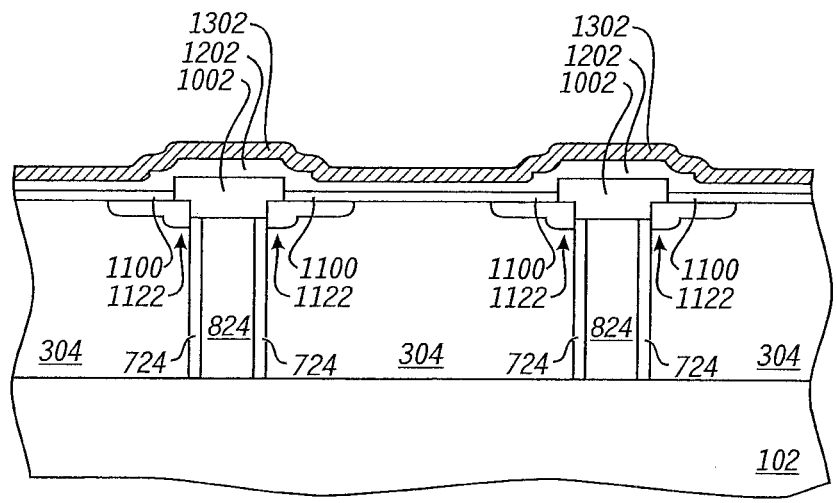

In FIG. 14, a conductive layer 1302 is deposited over the insulating layer 1202 and patterned to form openings 1304 where drain contact structures will be subsequently made to the drain regions 1102 of the transistor structures of high-side power transistors. The conductive layer 1302 includes a conductive material or may be made conductive, for example, by doping. More particularly, the conductive layer 1302 can include a doped semiconductor material (e.g., heavily doped amorphous silicon, polysilicon, etc.), a metal-containing material (a refractory metal, a refractory metal nitride, a refractory metal silicide, etc.), or any combination thereof. The conductive layer 1302 has a thickness in a range of approximately 0.05 microns to 0.5 approximately microns. In a particular embodiment, the conductive layer 1302 will be used to form a conductive electrode.

Figure 15:
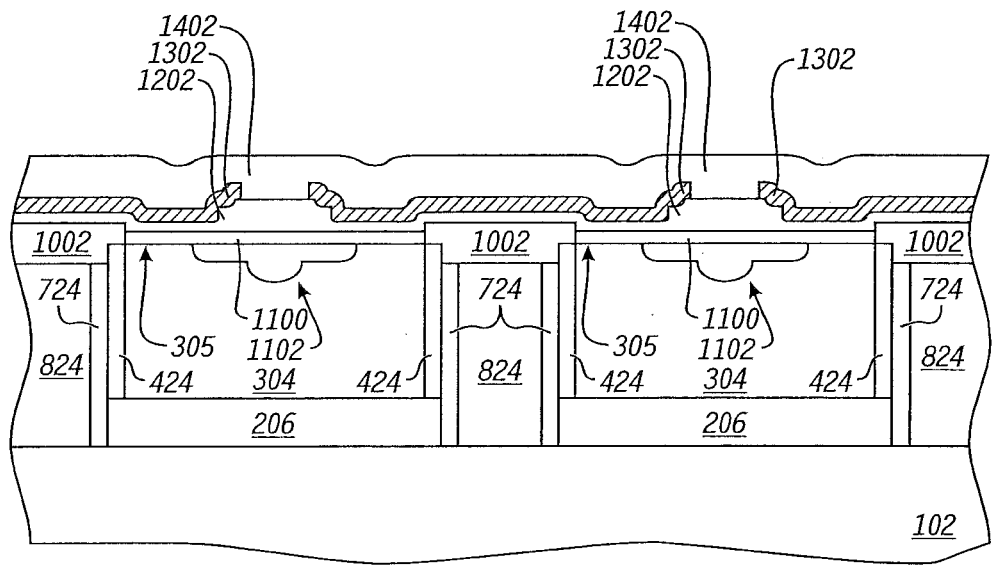
FIG. 15 includes an illustration of a cross-sectional view of the workpiece of FIG. 14 after forming an insulating layer over the patterned conductive layer.
Figure 15:
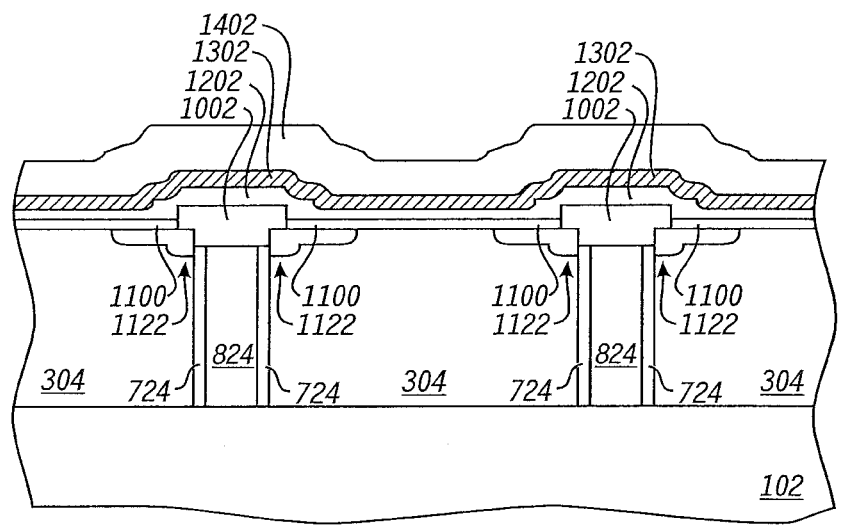

An insulating layer 1402 is formed over the conductive layer 1302, as illustrated in FIG. 15. The insulating layer 1402 can include a single film or a plurality of films. Each film within the insulating layer 1402 can include an oxide, a nitride, an oxynitride, or any combination thereof. In another particular embodiment, a nitride film lies closest to the conductive layer 1302 and has a thickness in a range of approximately 0.05 microns to approximately 0.2 microns. An oxide film overlies the nitride film and has a thickness in a range of approximately 0.2 microns to approximately 0.9 microns. An antireflective film may overlie the oxide film or may be incorporated elsewhere within the insulating layer 1402. For example, the nitride film can be selected with an appropriate thickness to serve as an etch-stop layer and as an antireflective film. In another embodiment, more or fewer films may be used, and thicknesses as described herein are merely illustrative and not meant to limit the scope of the present invention.

Figure 16:
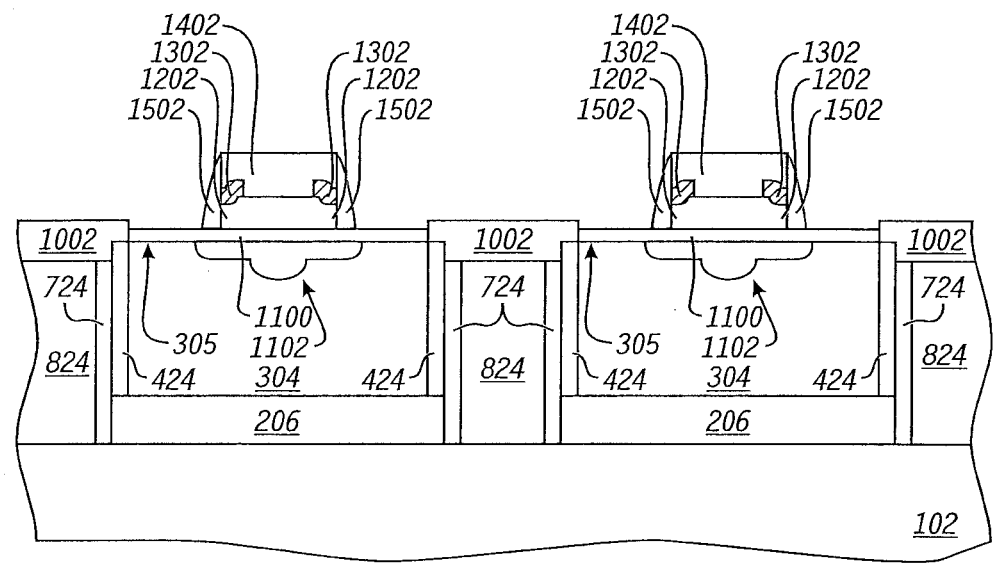
FIG. 16 includes an illustration of a cross-sectional view of the workpiece of FIG. 15 after patterning portions of the insulating and patterned conductive layers and forming sidewall spacers.
Figure 16:
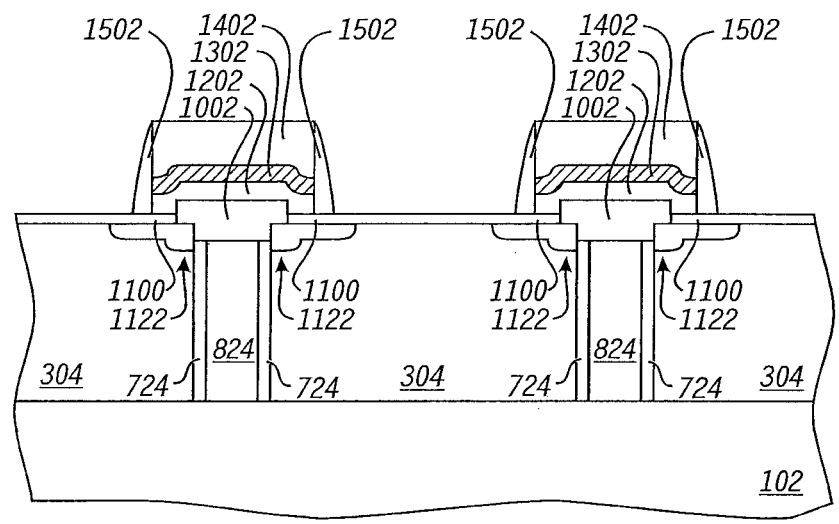

The insulating layer 1402, conductive layer 1302, and insulating layer 1202 are patterned to form openings, and insulating spacers 1502 are formed, as illustrated in FIG. 16. The openings are formed such that portions of the drain regions 1102 and 1122 underlie the openings. Such portions (i.e., portions 1106 and 1126 as illustrated in FIG. 12) allow part of the drain regions 1102 and 1122 to underlie part of a subsequently-formed gate electrode. Insulating spacers 1502 are formed along sides of the openings. Further, the conductive layer 1302 is patterned to form a portion within a region for the high-side power transistor, and a spaced-apart portion within different region for the low-side power transistor. The insulating spacers 1502 electrically insulate the conductive layer 1302 from a subsequently-formed gate electrode. The insulating spacers 1502 can include an oxide, a nitride, an oxynitride, or any combination thereof, and have widths at the bases of the insulating spacers 1502 in a range of approximately 50 nm to approximately 200 nm.

Figure 17:
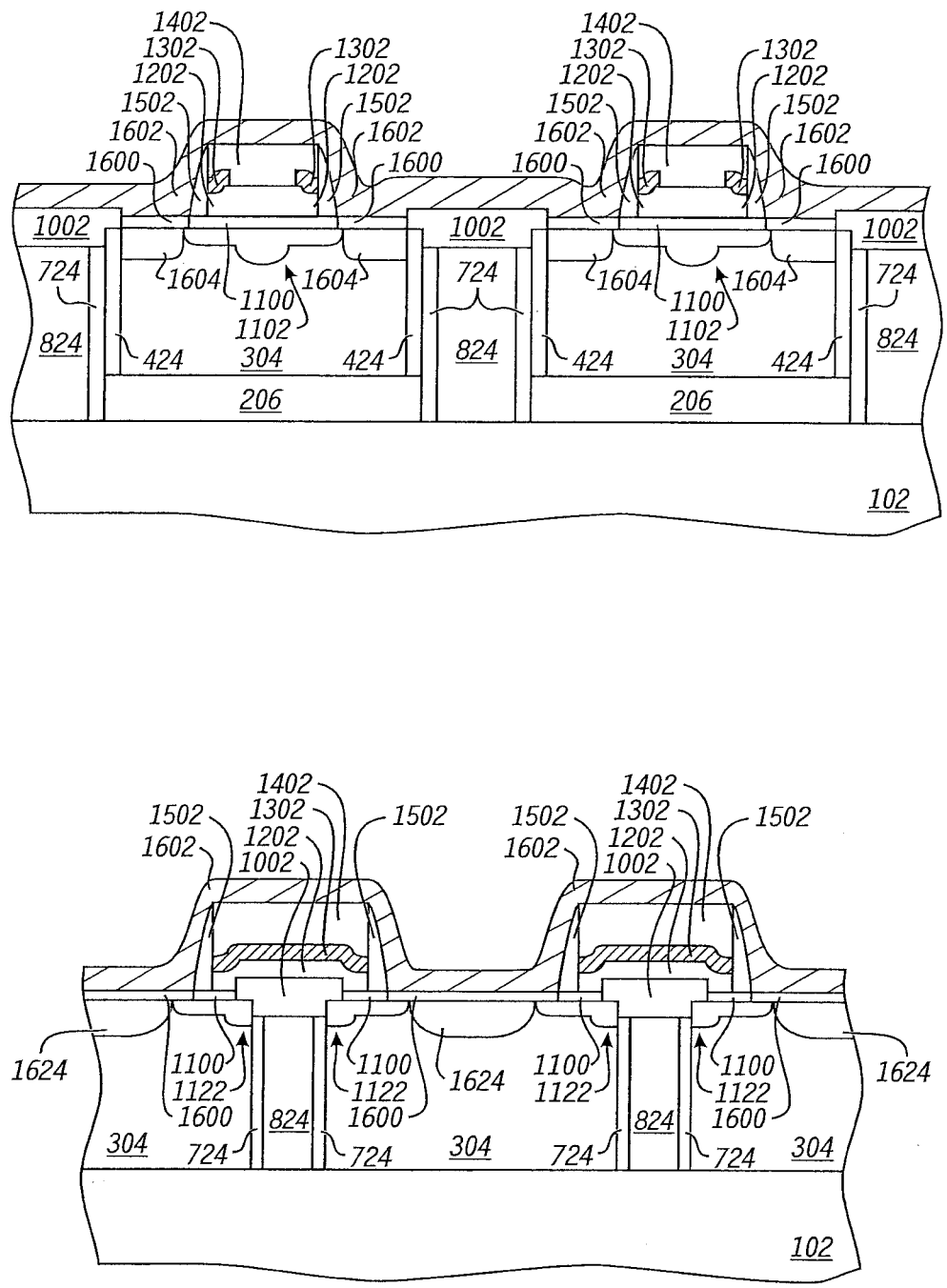
FIG. 17 includes an illustration of a cross-sectional view of the workpiece of FIG. 16 after forming another conductive layer and well regions.

FIG. 17 includes an illustration of the workpiece after forming a gate dielectric layer 1600, a conductive layer 1602, and well regions 1604 and 1624. Portions of the implant screen layer 1100 are removed by etching, and the gate dielectric layer 1600 is formed over the exposed surface of the workpiece. In a particular embodiment, the gate dielectric layer 1600 includes an oxide, a nitride, an oxynitride, or any combination thereof and has a thickness in a range of approximately 5 nm to approximately 100 nm. The conductive layer 1602 overlies the gate dielectric layer 1600 and can be part of subsequently-formed gate electrodes. The conductive layer 1602 can be conductive as deposited or can be deposited as a highly resistive layer (e.g., undoped polysilicon) and subsequently made conductive. The conductive layer 1602 can include a metal-containing or semiconductor-containing material. In one embodiment, the thickness of the conductive layer 1602 is selected such that, from a top view, substantially vertical edges of the conductive layer 1602 are near the edge of the drain regions 1102 and 1122. In an embodiment, the conductive layer 1602 is deposited to a thickness of approximately 0.1 microns to approximately 0.15 microns.

After the conductive layer 1602 is formed, the semiconductor layer 304 can be doped to form well regions 1604 in FIG. 17. The conductivity type of the well regions 1604 and 1624 are opposite that of the drain regions 1102 and 1122 and buried conductive region 102. In an embodiment, boron dopant is introduced through the conductive layer 1602 and the gate dielectric layer 1600 into semiconductor layer 304 to provide p-type dopant for the well regions 1604 and 1624. In one embodiment, the well regions 1604 have depths greater than a depth of subsequently-formed source regions, and in another embodiment, the well regions 1604 and 1624 have depths of at least approximately 0.3 microns. In a further embodiment, the well regions 1604 and 1624 have depths no greater than approximately 2.0 microns, and in still another embodiment, no greater than approximately 1.5 microns. By way of example, the well region 1604 and 1624 can be formed using two or more ion implantations. In a particular example, each ion implantation is performed using a dose of approximately $1.0 \times 10^{13}$ atoms/cm$^2$, and the two implants having energies of approximately 25 KeV and approximately 50

KeV. In another embodiment, more or fewer ion implantations may be performed in forming the well regions. Different doses may be used at the different energies, higher or lighter doses, higher or lower energies, or any combination thereof may be used to meet the needs or desires for a particular application.

In an alternate embodiment (not illustrated), the dose of the ion implantation forming well regions 1604 and 1624 is increased to compensate for the drain regions 1102 and 1122 when portions of lightly doped regions 1106 and 1126 extend across the unit cell of the transistor. In still another embodiment, conductive layer 1602 is not deposited, and the implant of forming well regions 1604 and 1624 uses sidewall spacers 1502 as a hardmask edge instead. In a further particular embodiment, these two embodiments can be combined.

Figure 18:
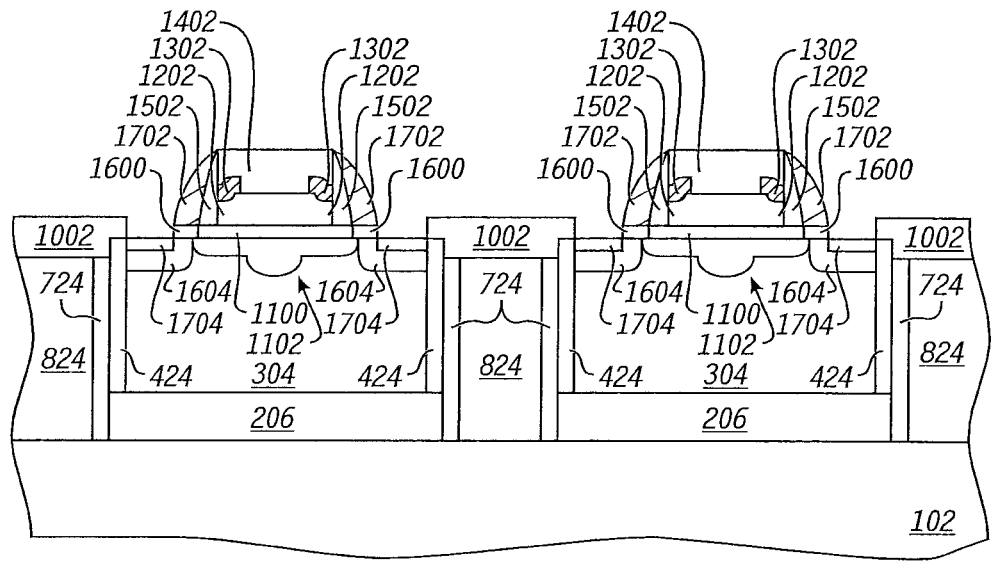
FIG. 18 includes an illustration of a cross-sectional view of the workpiece of FIG. 17 after forming a remaining portion of the conductive layer, etching the resulting conductive layer to form a gate electrode, and forming source regions.
Figure 18:
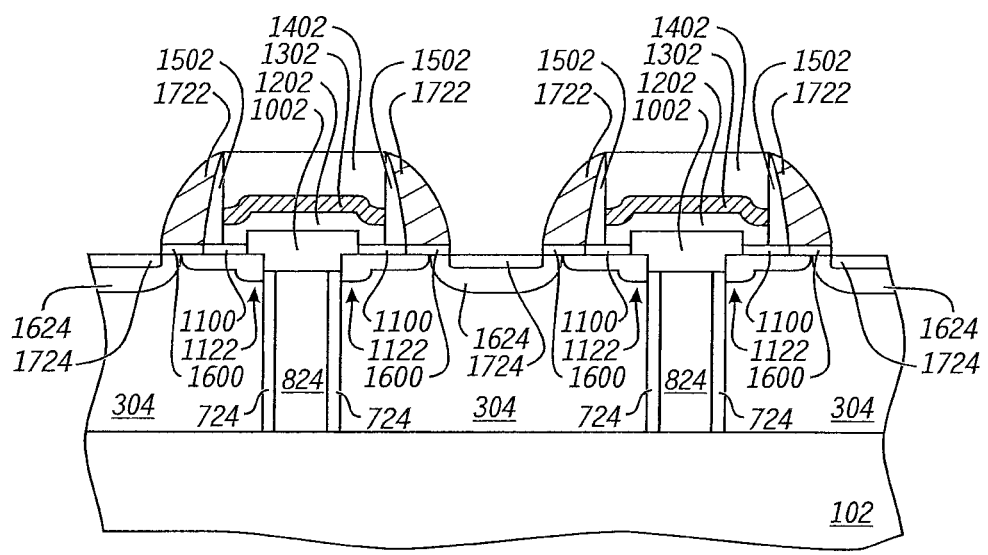

Additional conductive material is deposited on the conductive layer 1602 and etched to form to gate electrodes 1702 and 1722, as illustrated in FIG. 18. The additional conductive material can include any of the materials previously described with respect to the conductive layer 1602. Similar to the conductive layer 1602, the additional conductive material can be conductive as deposited or can be deposited as a highly resistive layer (e.g., undoped polysilicon) and subsequently made conductive. As between the conductive layer 1602 and additional conductive material, they can have the same composition or different compositions. The thickness of the composite conductive layer, including the conductive layer 1602 and the additional conductive material, has a thickness in a range of approximately 0.15 microns to approximately 0.5 microns. When layer 1602 is not present in the workpiece, the widths of the gate electrodes 1702 and 1722 (as measured along their bases) is defined by the thickness of a single conductive layer. In a particular embodiment, the additional conductive material includes polysilicon and can be doped with an n-type dopant during deposition or doped subsequently using ion implantation or another doping technique.

The composite conductive layer is anisotropically etched to form gate electrodes 1702 and 1722. In the illustrated embodiment, the gate electrodes 1702 and 1722 are formed without using a mask and have shapes of sidewall spacers, and in particular one or more arcuate surfaces. Widths of the gate electrodes 1702 and 1722 can be measured at a location where the gate electrodes 1702 and 1722 are closest to the gate dielectric layer 1600. Widths of the gate electrodes may be approximated using the thickness of the compositing conductive layer. In an embodiment, the widths of the gate electrodes can be at least approximately 0.05 microns, at least approximately 0.10 microns, or at least approximately 0.15 microns. In another embodiment, widths of the gate electrodes may be no greater than approximately 0.9 microns, no greater than approximately 0.8 microns, or no greater than approximately 0.7 microns. Height of the gate electrodes 1702 and 1722 can be approximated by an elevation difference between an upper surface of the insulating layer 1402 and an upper surface of the gate dielectric layer 1600. In an embodiment, the widths of the gate electrodes can be at least approximately 0.20 microns, at least approximately 0.50 microns, or approximately at least 0.7 microns. In another embodiment, widths of the gate electrodes may be no greater than approximately 3.0 microns, no greater than approximately 2.0 microns, or no greater than approximately 1.5 microns. Further, a ratio of the height to the width of the gate electrodes 1702 and 1722 can be a significant feature. For some or all of the gate electrodes 1702 and 1722, each of such some or all gate electrodes can have a height that is greater than its corresponding width. In an embodiment, the ratio of the height to the width of a gate electrode can be at least approximately 1.1:1, at least approximately 1.5:1, or at least approximately 2.0:1. In another embodiment, the ratio of the height to the width of a gate electrode may be no greater than approximately 20:1 microns, no greater than approximately 9:1 microns, or no greater than approximately 7:1 microns. As will be described later in this specification, physical design of electronic device, and in particular, the shapes and locations of the gate electrodes 1702 and 1722 and adjacent conductive features allow gate taps to be unlanded contacts and can contact the gate electrodes 1702 and 1722 at locations directly above channel regions of the transistor structures.

An insulating layer (not illustrated) may be thermally grown from the gate electrodes 1702 and 1722 or may be deposited over the workpiece. The thickness of the insulating layer can be in a range of approximately 10 nm to approximately 30 nm.

Source regions 1704 and 1724 can be formed using ion implantation. The source regions 1704 and 1724 are heavily doped and have an opposite conductivity type as compared to the well regions 1604 and 1624 and the same conductivity type as the drain regions 1102 and 1122 and the buried conductive region 102. The portions of the well regions 1604 lying between the source regions 1704 and drain regions 1102 and underlying the gate electrodes 1702 are channel regions of transistor structures of the high-side power transistor, and the portions of the well regions 1624 lying between the source regions 1724 and drains 1122 and underlying the gate electrodes 1722 are channel regions of the transistor structures of the low-side power transistor.

Figure 19:
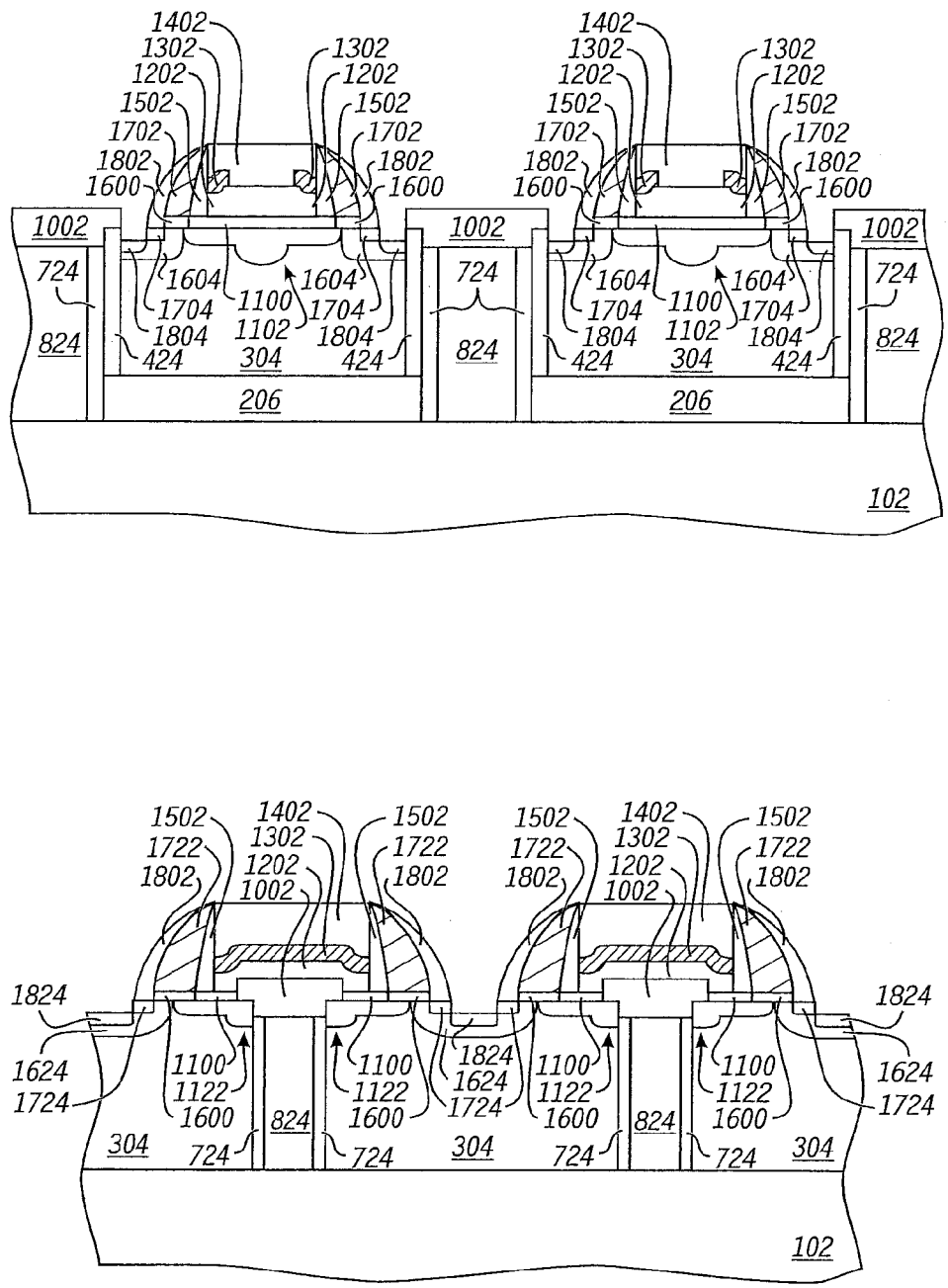
FIG. 19 includes an illustration of a cross-sectional view of the workpiece of FIG. 18 after forming sidewall spacers, etching portions of the source regions, and forming well contact regions.

Well contact regions 1804 and 1824 are formed within the well regions 1604 and 1624, respectively, as illustrated in FIG. 19. Insulating spacers 1802 are formed along the gate electrodes 1702 and 1722 and cover portions of the source regions 1704 and 1724 closer to the gate electrodes 1702 and 1722, wherein exposed portions (not illustrated in FIG. 19) of the source regions 1704 and 1724 lie closer to the conductive plugs 1002. The insulating spacers 1802 can include an oxide, a nitride, an oxynitride, or any combination thereof, and have widths at the bases of the insulating spacers 1802 in a range of approximately 50 nm to approximately 500 nm.

The exposed portions of the source regions 1704 and 1724 are etched to expose underlying portions of the well regions 1604 and 1624, respectively. Depending on the composition of the conductive plugs, portions of the conductive plugs 1002 may or may not be etched when the source regions 1704 and 1724 are etched. If the conductive plugs 1002 and the semiconductor layer 304 (from which the well regions 1604 and 1624 and the source regions 1704 and 1724 are formed) are principally silicon, then part or all of the conductive plugs 1002 may be etched when etching through the source regions 1704 and 1724. If the conductive plugs 1002 and source regions 1704 and 1724 include dissimilar materials, substantially none or an insignificant portion of the conductive plugs 1002 may be etched when etching through the source regions 1704 and 1724.

Well contact regions 1804 and 1824 are formed from the exposed portions of the well regions 1604 and 1624, respectively. The well contact regions 1804 and 1824 have the same conductivity type as the well regions 1604 and 1624 and have the opposite conductivity type as compared to the source regions 1704 and 1724. In a particular embodiment, the well contact regions 1804 and 1824 have a dopant concentration of at least approximately $10^{19}$ atoms/cm$^3$ to allow ohmic contacts to be subsequently formed.

In another embodiment (not illustrated), an additional implant (not illustrated) of the same conductivity type as the well regions 1604 and 1624 and of the opposite conductivity type as the source regions 1704 and 1724 may be used to form well contact regions below the source regions 1704 and 1724. The additional implant may be performed before or after forming the source regions 1704 and 1724 and before forming the insulating spacers 1802. In this embodiment, the well contact regions 1804 and 1824 underlie substantially all of the source regions 1704 and 1724, respectively. After the source regions 1704 and 1724 and the well contact regions 1804 and 1824 are formed, the insulating spacers 1802 are formed such that only portions of the source regions 1704 and 1724 are covered. An etch as previously described is performed to remove portions of the source regions 1704 and 1724 and expose portions of the underlying well contact regions. At this point in the process, the transistor structures of the high-side and low-side power transistors are formed.

Figure 20:
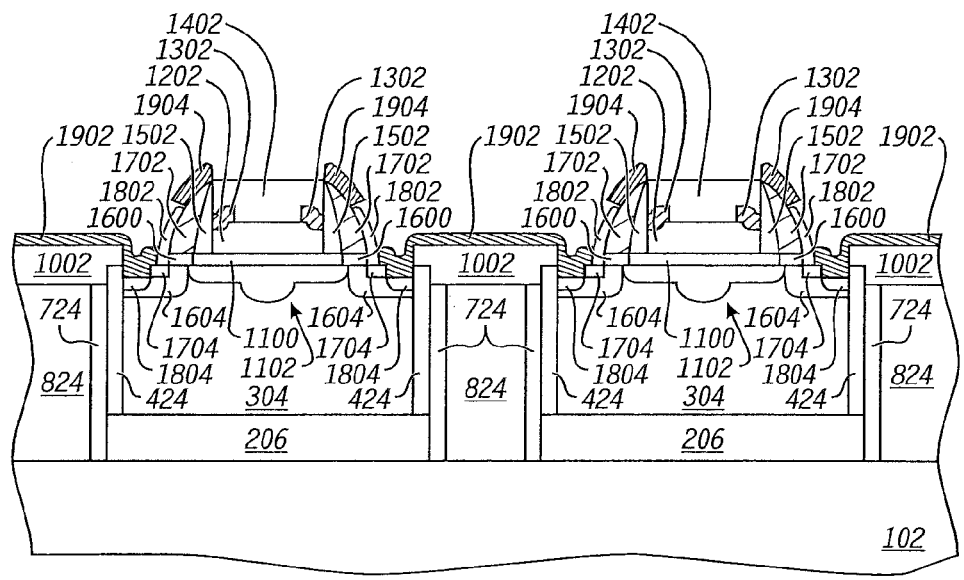
FIG. 20 includes an illustration of a cross-sectional view of the workpiece of FIG. 19 after forming conductive straps and conductive members.
Figure 20:
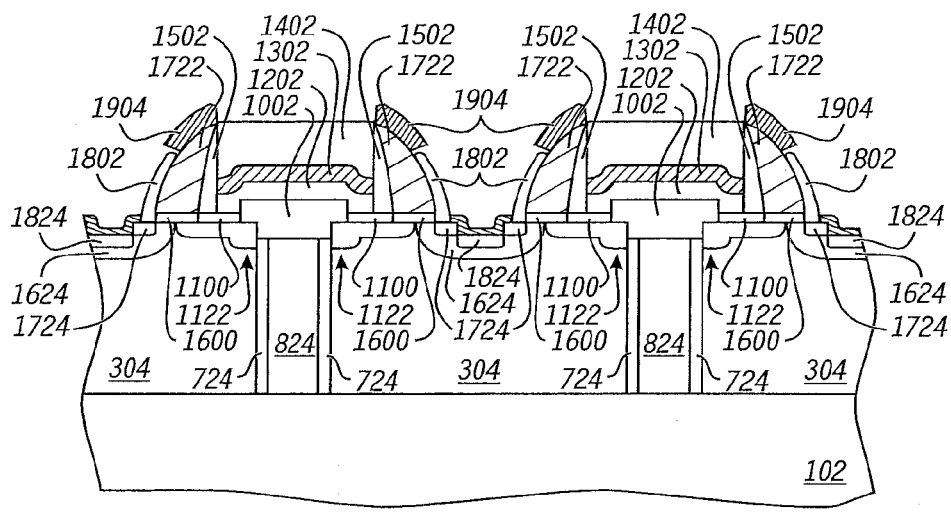

Referring to FIG. 20, portions of the insulating spacers 1802 are etched to expose portions of the source regions 1704 and 1724, well contact regions 1804 and 1824, and the upper portions of the gate electrodes 1702 and 1722. Conductive straps 1902 are then formed to electrically connect the source regions 1704, well contact regions 1804, and corresponding conductive plugs 1002 together, and other conductive straps 1902 are formed to electrically connect the source regions 1724 and well contact regions 1824 together. Conductive members 1904 are formed over exposed portions of the gate electrodes 1702 and 1722, and allow resistance along the length of the gate electrode (in a direction into or out of the transistor structures illustrated in FIG. 20) to be lower than in the absence of the conductive members 1904. In this specification, the conductive members 1904 may be considered part of the gate electrodes for the transistor structures, and accordingly, the gate electrodes 1702 and 1722 may be considered the bodies of the gate electrodes. In a particular embodiment, a refractory metal, such as Ti, Ta, W, Co, Pt, or the like, can be deposited over the workpiece and selectively reacted with exposed silicon, such as substantially monocrystalline or polycrystalline silicon, to form a metal silicide. Unreacted portions of the refractory metal overlie the insulating layer 1402 and insulating spacers 1802 are removed, thus leaving the conductive straps 1902 and conductive members 1904. Note that the conductive members 1904 are spaced apart from the conductive straps 1902, and therefore, an electrical short is not formed between the gate electrodes 1702 and 1722 and any of the source regions 1704 and 1724 and well contact regions 1804 and 1824.

Figure 21:
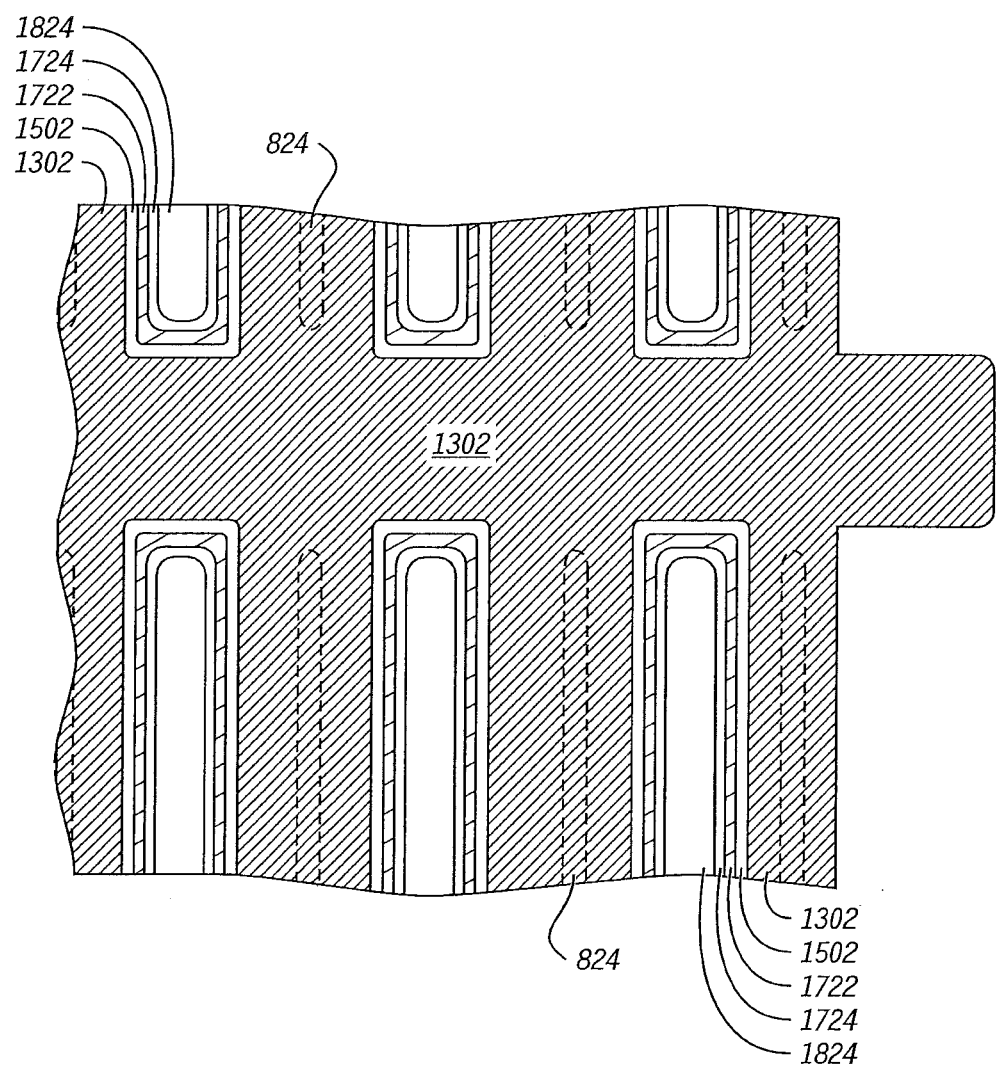
FIG. 21 includes a top view of the workpiece of FIG. 20 in accordance with a particular embodiment.

FIG. 21 includes an illustration of a top view of an exemplary physical design that can be used for the low-side power transistor structures. Other than the insulating spacers 1802, none of the insulating layers are illustrated to simplify positional relationships between features as illustrated in FIG. 21. In the embodiment as illustrated, only a portion of the low-side power transistor is illustrated. In FIG. 21, the well contact regions 1824 are surrounded by corresponding source regions 1724. The conductive straps 1902 are illustrated by lines extending through the well contact regions 1824 and the source regions 1724. Insulating spacers 1802 are disposed between the source regions 1724 and the gate electrodes 1722. The conductive layer 1302 surrounds the gate electrodes 1722. Note that the gate electrodes 1722 are not electrically connected to the conductive layer 1302 due to the insulating spacers 1502, which are covered by the gate electrodes 1722 due to the arcuate surface of the gate electrodes 1722. The conductive structures 824, which are within trenches, are illustrated even though such conductive structures 824 would not normally be visible from a top view at this point in the process. The conductive structures 824 are at locations where the drain regions 1122 of the transistor structures of the low-side power transistor are electrically connected to the buried conductive regions 102. The features for the high-side power transistor would be nearly the same, except that portions of the conductive layer 1302 are removed from over portions of the drain regions 1102. After reading this specification, skilled artisans will appreciate that FIG. 21 illustrates only one embodiment, and that many other embodiments can be made without departing from the concepts as disclosed herein.

Figure 22:
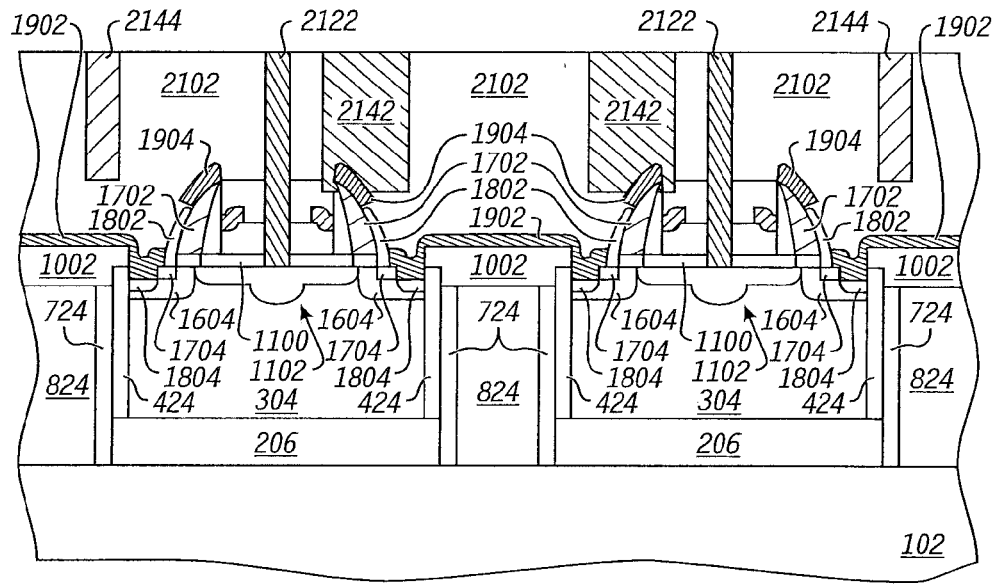
FIG. 22 includes an illustration of a cross-sectional view of the workpiece of FIG. 20 after forming an interlevel dielectric layer, conductive plugs, gate taps, and gate runners.
Figure 22:
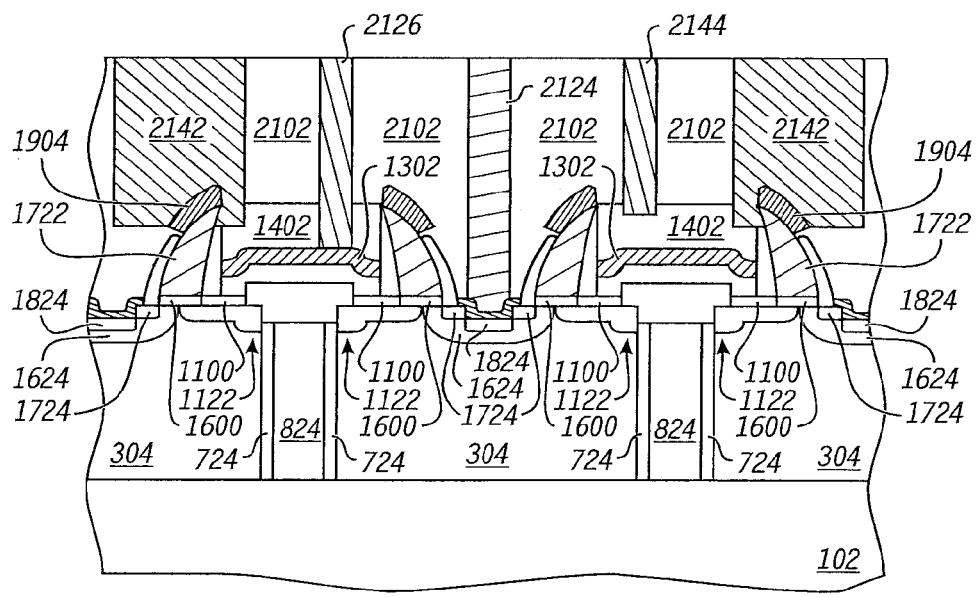

FIG. 22 includes an illustration after forming an interlevel dielectric (ILD) layer 2102 and conductive plugs 2122, 2124, 2126, gate taps 2142, and gate runners 2144. The ILD layer 2102 can include a single film having a substantially constant or changing composition (e.g., a high phosphorus content further from the semiconductor layer 304) or a plurality of discrete films. An etch-stop film, an antireflective film, or a combination may be used within or over the ILD layer 2102 to help with processing. The ILD layer 2102 may be planarized to improve process margin during subsequent processing operations (e.g., lithography, subsequent polishing, or the like). A resist layer (not illustrated) is formed over the ILD layer 2102 and is patterned to define resist layer openings. An anisotropic etch is performed to define openings that extend through the ILD layer 2102 to expose portions of the drain regions 1102 and conductive straps 1902, conductive members 1904, and the conductive layer 1302, as illustrated in FIG. 21. The etch can be performed as a timed etch or as an endpoint detected etch with a timed overetch. The endpoint may be detected when the drain regions 1102 or the conductive straps 1902 become exposed.

The conductive plugs 2122, 2124, 2126, gate taps 2142, and gate runners 2144 are formed within the contact openings within the ILD layer 2102. The conductive plugs 2122 are electrically connected to the drain regions 1102 of the transistor structures of the high-side power transistor, the conductive plugs 2124 (only one of which is illustrated in FIG. 22) are electrically connected to the source regions 1724 and well contact regions 1824 (via the conductive straps 1902) of transistor structures of the low-side power transistor, and the conductive plugs 2126 are electrically connected to the conductive layer 1302. The gate taps 2142 are electrically connected to conductive members 1904, and each of the gate runners 2144 electrically connect a set of gate taps 2142 to each other and to route a gate signal to the gate electrodes. The conductive plugs 2122, 2124, 2126, gate taps 2142, and gate runners 2144 can be formed by depositing one or more of the conductive materials previously described in forming the conductive structures 824 or a conductive material used in interconnects, such as copper, a noble metal, aluminum, or the like. The conductive material(s) are deposited over the ILD layer 2102 and substantially fill the openings within the ILD layer 2102. Portions of the conductive material(s) lying outside of the openings are removed by polishing, etching or the like. The removal can be performed as a timed removal or as an endpoint detected removal with a timed over-removal. The endpoint may be detected when the ILD layer 2102 becomes exposed.

The openings in the ILD layer 2102 and the conductive plugs 2122, 2124, 2126, gate taps 2142, and gate runners 2144 may be formed at different times. In one embodiment, patterning the ILD layer 2102 to define openings for the conductive plugs 2122, 2124, and 2126, and forming the conductive plugs 2122, 2124, and 2126 may be formed during a process sequence during a particular time period, and patterning the ILD layer 2102 to define openings for the gate taps 2142 and gate runners 2144, and forming the gate taps 2142 and gate runners 2144 may be formed during a different process sequence during a different time period. In another embodiment, openings within the ILD layer 2102 may be formed at different times, and the conductive plugs 2122, 2124, and 2226, gate taps 2142, and gate runners 2144 may be formed during the same process sequence. After reading this specification, skilled artisans will be able to integrate the process sequences, use fewer or more process sequences, or modify the process sequences for their particular applications.

Figure 23:
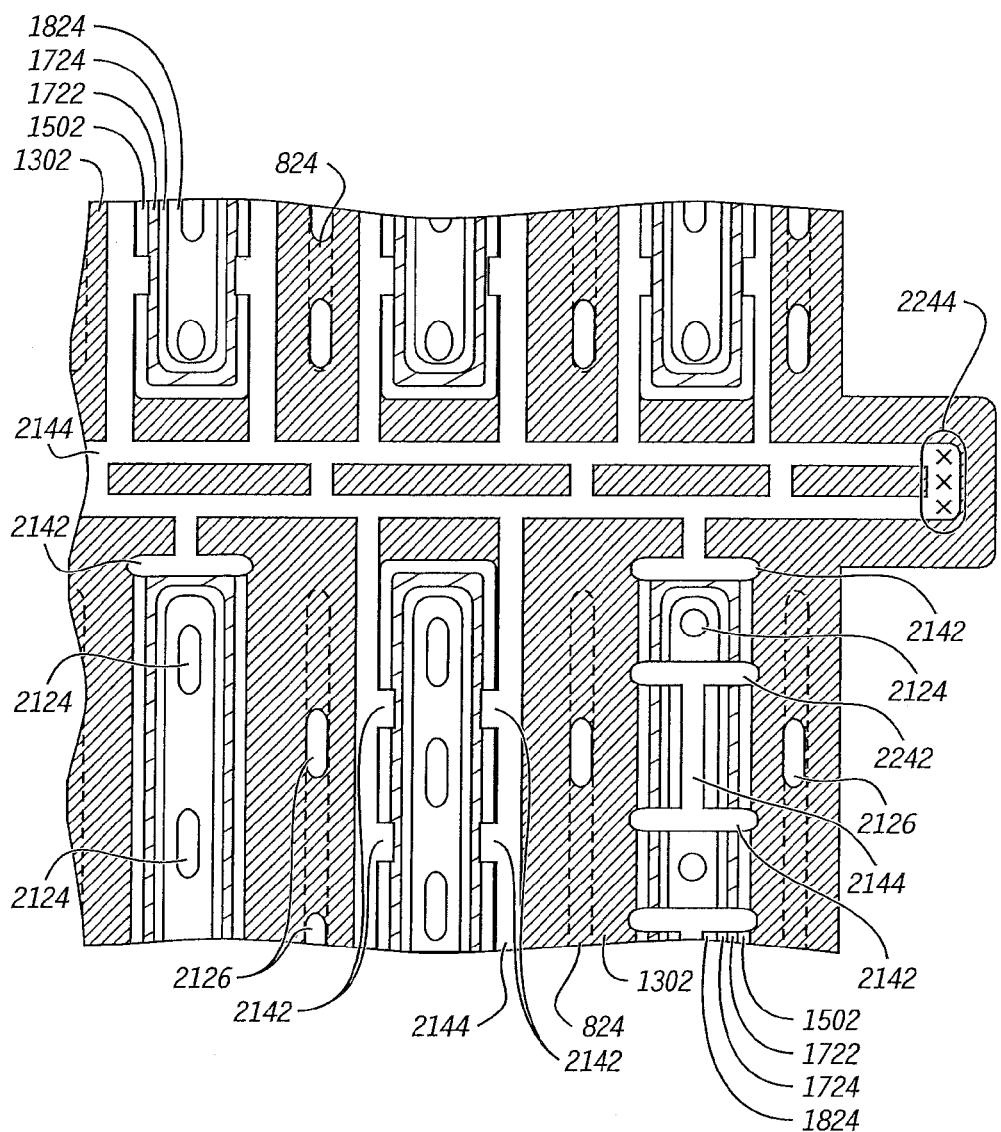
FIGS. 23 and 24 include top views of the workpiece of FIG. 22 in accordance with particular embodiments.

FIG. 23 includes an illustration of a top view of an exemplary physical design that can be used for the transistor structures of the low side-transistor at this point in the process. In the embodiment as illustrated, the gate taps 2142 and the gate runners 2144 can be different parts of the same conductive structure. The gate runners 2144 can electrically connect gate taps 2142 to one another and provide a routing path for the gate signal to the transistor structures of the low-side power transistor. Region 2244 can be a location where the conductive structure makes contact with a via for an interconnect that provides the gate signal for the transistor structures of the low-side power transistor. In the embodiment as illustrated, the gate taps 2142 are unlanded gate contacts, as underlying gate electrodes have elevational differences between tops of the gate electrodes and the conductive layer 1302 to allow sufficient process margin when forming the gate taps 2142 without causing an electrical short or leakage path between an underlying gate electrode and an adjacent portion of the conductive layer 1302. The gate taps 2142 can be wider than the widths of the corresponding underlying gate electrodes, and can contact the corresponding underlying gate electrodes directly over the channel regions of the transistor structures. In another embodiment not illustrated the gate taps 2142 may be no wider than the widths of the corresponding underlying gate electrodes, may contact the corresponding underlying gate electrodes directly over a field isolation region, or any combination of these features.

Many different shapes can be used for the conductive structures that include the gate taps 2142 and gate runner 2144. The transistor structure at the bottom left-hand side of FIG. 23 has a gate tap 2142 that only contacts the gate electrode at the end. The transistor structure at the bottom center of FIG. 23 has gate taps 2142 that contact the gate electrode at locations along the span of the gate electrode. The transistor structure at the bottom right-hand side of FIG. 23 includes a conductive structure similar to the one in the transistor structure at the bottom left-hand side of FIG. 23. The transistor structure at the bottom right-hand side includes shunts 2242, which are a specific type of conductive structure. The shunts 2242 include gate taps 2142 and gate runners 2144. Because the conductive structures including the gate taps 2142 and gate runners 2144 are more conductive than the gate electrodes, the shunts 2242 have a lower the resistance than the underlying gate electrodes, even though the underlying gate electrodes include the conductive members 1904. Note that the gate runners 2144 of the shunts 2244 overlies the source/well contact regions, and thus have less capacitive coupling as compared to gate runners 2144 that overlie the conductive layer 1302.

Figure 24:
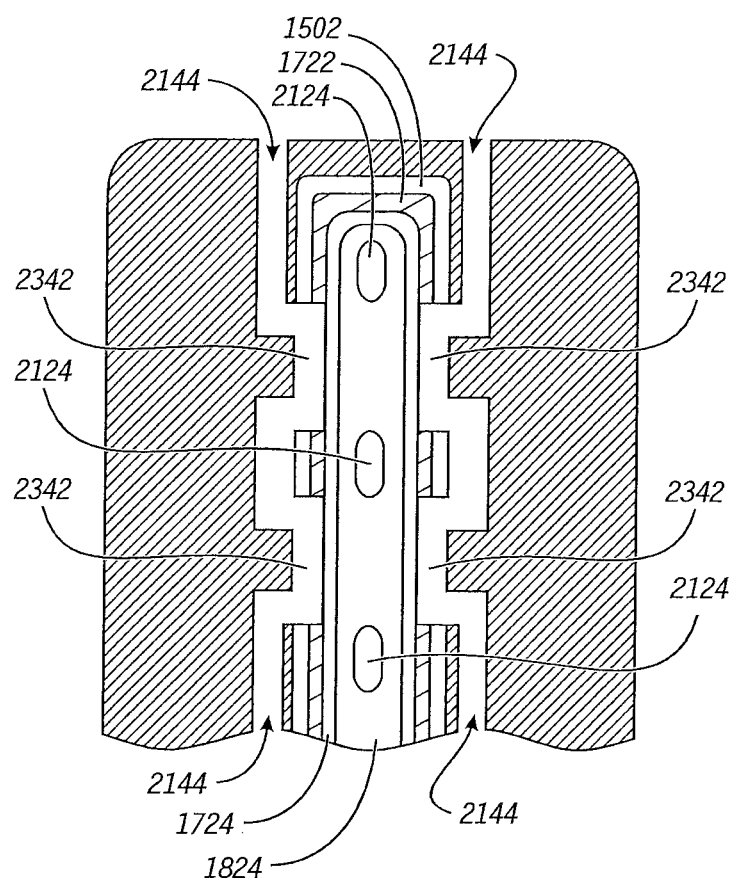

FIG. 24 includes an illustration of an alternative embodiment in which the conductive structures has a serpentine shape. In the embodiment illustrated in FIG. 24, the conductive structures include gate taps 2342 and gate runners 2144. The gate taps 2324 are narrower than the gate taps 2142. In another embodiment (not illustrated), the gate runners 2144 can be shallower than the gate taps 2142 or 2342. In this embodiment, the conductive structures including the gate runners 2144 and gate taps 2142 or 2342 can be formed using a dual inlaid process sequence similar to a dual inlaid process sequence used for forming interconnects and vias or contacts.

The different configurations have different parasitic resistances and parasitic capacitances, and circuit designers can design circuits accordingly to compensate for such parasitic resistance and parasitic resistances. In the finished electronic device, the conductive layer 1302 will be electrically connected to the source/well contact regions of the transistor structures of each of the high-side and low-side power transistors. Accordingly, the gate taps 2142, the gate runners 2144, or any combination thereof can significantly contribute to source-to-gate capacitance. Referring to FIG. 23, the transistor structure at the bottom left-hand side will have the highest gate resistance and the lowest source-to-gate capacitance as compared to the other two transistor structures near the bottom of FIG. 23. The transistor structure at the bottom center will have the lowest gate resistance and the highest source-to-gate capacitance as compared to the other two transistor structures near the bottom of FIG. 23. The parasitic resistance and parasitic capacitances can be tuned by modifying the shapes of the conductive members that include the gate taps 2142 and the gate runners 2144.

The design rules for the conductive plugs 2122, 2124, 2126, and the gate runners 2144 may have substantially the same minimum feature width and substantially the same minimum spacing between features. Accordingly, in a particular embodiment, the conductive plugs 2122, 2124, and 2126, which are the drain contacts, source/well region contacts (that is, both source contacts and well region contacts), and conductive layer contacts, may have minimum widths that are within 10% of the minimum width of the gate runners 2144.

The conductive plugs 2122, 2124, 2126, gate taps 2142, and gate runners 2144 can be arranged so that design rules for minimum spacings are not violated. Referring to FIG. 23, the location of the conductive plugs 2124 (source/well region contacts) and gate taps 2142 can be staggered, so that a conductive plug 2124 is not too close to a gate tap 2142. The spacings between the conductive plugs 2126 (contacts to portions of the conductive layer 1302) and the gate runners 2144 and between the conductive plugs 2122 (drain contacts for the transistor structures of the high-side power transistor) are not as problematic. Still, the a gate runner 2144 may be arranged so that it does not get too close to the conductive plugs 2122 or 2126.

In FIG. 23, each type of features may have substantially the same shape or different shapes. In the embodiments illustrated, the conductive plugs 2122 have different shapes as compared to each other, the gate taps 2142 have different shapes as compared to each other, and the conductive plugs 2126 have substantially the same shape. In another embodiment, the conductive plugs 2122 have substantially the same shape, the gate taps 2142 conductive plugs 2122 have substantially the same shape, and the conductive plugs 2126 have different shapes as compared to each other.

The features for the high-side power transistor would be nearly the same as illustrated for the low-side power transistor in FIG. 23, except that portions of the conductive layer 1302 are removed from over portions of the drain regions 1102 so that conductive plugs 2122 may contact to the drain regions 1102. After reading this specification, skilled artisans will appreciate that FIGS. 23 and 24 illustrate only some of the embodiments, and that many other embodiments can be made without departing from the concepts as disclosed herein.

Figure 25:
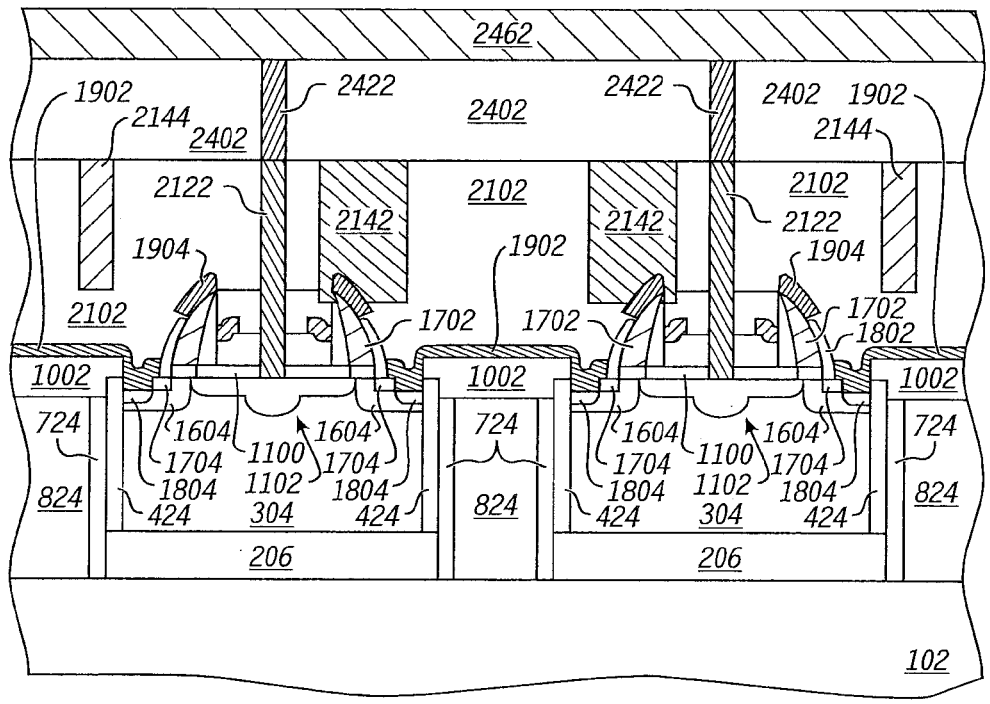
FIG. 25 includes an illustration of a cross-sectional view of the workpiece of FIG. 20 after forming a substantially completed electronic device in accordance with an embodiment of the present invention.
Figure 25:
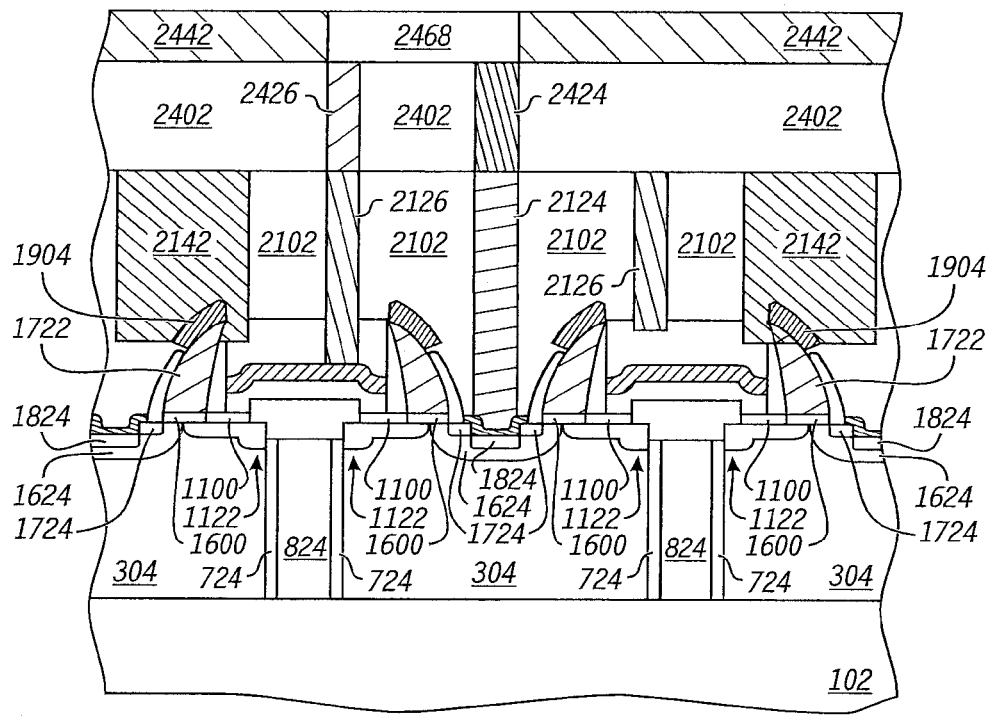

FIG. 25 includes an illustration of a substantially completed electronic device. An ILD layer 2402 is formed and can include an oxide, a nitride, an oxynitride, or any combination thereof. The ILD layer 2402 can include a single film having a substantially constant or changing composition (e.g., a high phosphorus content further from the semiconductor layer 304) or a plurality of discrete films. An etch-stop film, an antireflective film, or a combination may be used within or over the ILD layer 2402 to help with processing. The ILD layer 2402 may be planarized to improve process margin during subsequent processing operations (e.g., lithography, subsequent polishing, or the like).

A resist layer (not illustrated) is formed over the ILD layer 2402 and is patterned to define resist layer openings. An anisotropic etch is performed to define via openings that extend through the ILD layer 2402 to expose portions of the conductive plugs 2122, 2124, 2126, and the gate runners 2144 (at locations not illustrated in FIG. 25). The etch can be performed as a timed etch or as an endpoint detected etch with a timed overetch. The endpoint may be detected when the conductive plugs 2122, 2124, or 2126, or the gate runners 2144 become exposed.

Conductive plugs 2422, 2424, and 2426 are formed within the via openings within the ILD layer 2402. Conductive plugs will also be formed to the gate runners 2144 at locations not illustrated in FIG. 25. The conductive plugs 2422 are electrically connected to the conductive plugs 2122, the conductive plugs 2424 are electrically connected to the conductive plugs 2124, and the conductive plugs 2426 are electrically connected to the conductive plugs 2126.

Another ILD layer 2442 is formed and can include an oxide, a nitride, an oxynitride, or any combination thereof. The ILD layer 2442 can include a single film having a substantially constant or changing composition (e.g., a high phosphorus content further from the semiconductor layer 304) or a plurality of discrete films. An etch-stop film, an antireflective film, or a combination may be used within or over the ILD layer 2442 to help with processing. The ILD layer 2442 may be planarized to improve process margin during subsequent processing operations (e.g., lithography, subsequent polishing, or the like).

A resist layer (not illustrated) is formed over the ILD layer 2442 and is patterned to define resist layer openings. An anisotropic etch is performed to define interconnect trenches that extend through the ILD layer 2442 to expose portions of the conductive plugs 2422, 2424, 2426, and other conductive plugs that are electrically connected to the gate runners 2144 (at locations not illustrated in FIG. 25). The etch can be performed as a timed etch or as an endpoint detected etch with a timed overetch. The endpoint may be detected when the conductive plugs within the ILD layer 2402 become exposed.

Interconnects 2462 and 2468 are formed within the interconnect trenches within the ILD layer 2402. Interconnects will also be formed to conductive plugs that are electrically connected to the gate runners 2144 at locations not illustrated in FIG. 25. The interconnect 2462 is electrically connected to the conductive plugs 2422 that are electrically connected to the drain regions 1102 of the transistor structures of the high-side power transistor and is part of or electrically connected to a drain terminal for the high-side power transistor.

The interconnect 2468 is electrically connected to the conductive plugs 2424 and 2426 and electrically connects the conductive layer 1302 to the source/well contact regions of a transistor structure. The interconnect 2468 is electrically connected to other transistor structures of the low-side power transistor and is part of or electrically connected to a source terminal for the low-side power transistor. In an embodiment, the interconnect 2468 may be the only interconnect at the interconnect level illustrated that is electrically connected to other portions of the conductive layer 1302 for the low side power transistor and to all other source/well contact regions for transistor structures of the low-side power transistor. In another embodiment, one or more additional interconnects similar to the interconnect 2468 may be electrically connected to other portions of the conductive layer 1302 for the low side power transistor and to other source/well contact regions for transistor structures of the low-side power transistor. In this particular embodiment, the interconnect 2468 and such other interconnects may be electrically connected with an interconnect (not illustrated) at a different interconnect level.

One or more additional interconnects (not illustrated) similar to interconnect 2468 can be used to electrically connect other portions of the conductive layer 1302 for the high-side power transistor and to source/well contact regions for transistor structures of the high-side power transistor. Unlike the interconnect 2468, such additional interconnects may be local to the high-side power transistor and not directly contact terminals or structures outside of the high-side power transistor. The additional interconnects are electrically connected to an output terminal for the high-side and low-side power transistor combination via the conductive structures 824 (within the high-side power transistor) and the buried doped region 102.

Further interconnects and corresponding conductive plugs are used to connect the gate electrodes to gate terminals. One set of interconnects and conductive plugs are electrically connected to a high-side gate terminal and the gate runners 2144 for the underlying gate electrodes of transistors structures of the high-side power transistor, and another set of interconnects and conductive plugs are electrically connected to a low-side gate terminal and the gate runners 2144 for underlying gate electrodes of the transistors structures of the low-side power transistor.

Although not illustrated, more or fewer layers or features may be used as needed or desired to form the electronic device. Field isolation regions are not illustrated but may be used to help electrically isolate portions of the high-side power transistors from the low-side power transistors. In another embodiment, more insulating and interconnect levels may be used. For example, a particular interconnect level can be used to electrically connect the source/well contact regions, and a different interconnect level can be used to electrically connect the gate electrodes. A passivation layer can be formed over the workpiece as illustrated in FIG. 25. After reading this specification, skilled artisans will be able to determine layers and features for their particular application.

In another embodiment, the gate electrodes 1702 and 1722 may be recessed, and subsequently-formed conductive plugs can contact the gate electrodes 1702 and 1722 within the recessions. The gate electrodes 1702 and 1722 can be initially formed to be relatively narrow and high. Such a geometry can be useful in achieving a small gate width and still block implants, such as for the source regions 1704 and 1724 and the well contact regions 1804 and 1824. After the implants have been performed, the gate electrodes 1702 and 1722 do not need to act as an implant blocking feature. Thus, the gate electrodes 1702 and 1722 can be significantly reduced in thickness at this point in the process.

Figure 26:
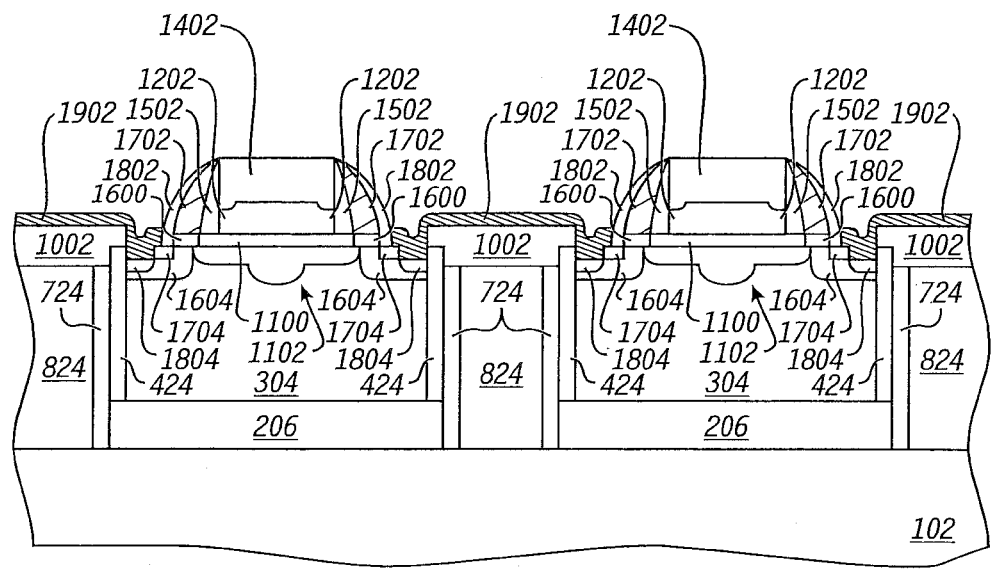
FIG. 26 includes an illustration of a cross-sectional view of the workpiece of FIG. 19 after forming conductive straps in accordance with another embodiment.
Figure 26:
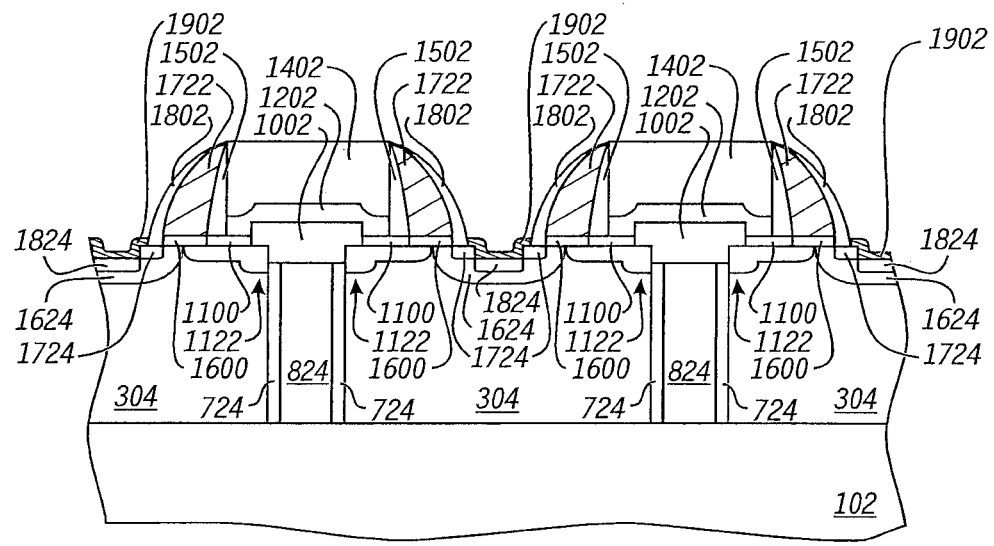

A workpiece is processed as described up to and including the workpiece as illustrated in FIG. 19, except that the conductive layer 1302 is not formed or is formed elsewhere in the electronic device in this particular embodiment. Further, the insulating layer 1202 may have different thicknesses as previously described or may have substantially the same thickness. Referring to FIG. 26, the insulating spacers 1802 may not be significantly etched and may substantially prevent the conductive members (see conductive members 1904 in FIG. 20) from forming when forming the conductive straps 1902 as previously described.

Figure 27:
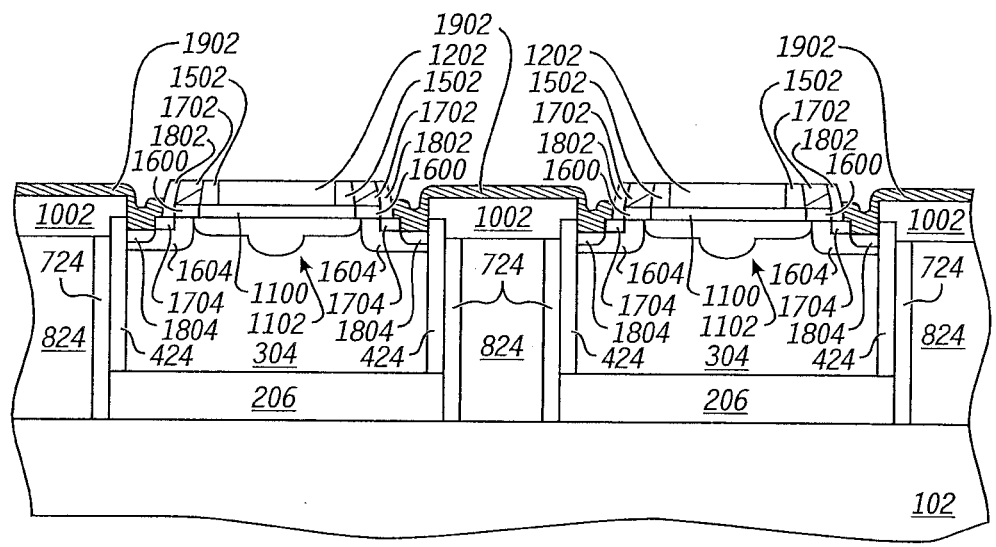
FIG. 27 includes an illustration of a cross-sectional view of the workpiece of FIG. 26 after reducing the heights of gate electrodes.
Figure 27:
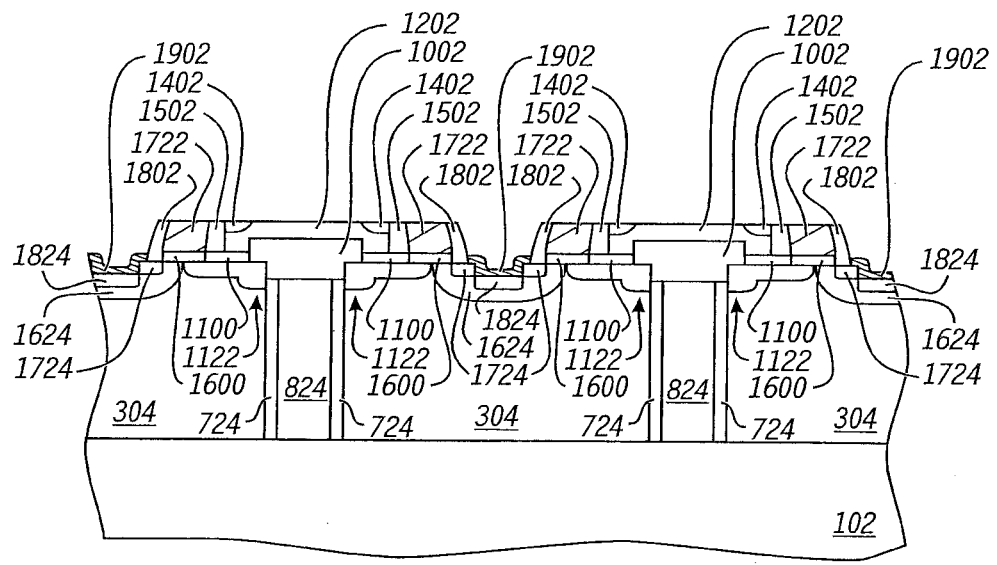

In an embodiment illustrated in FIG. 27, portions of the gate electrodes 1702 and 1722 and insulating layers may be reduced in height. A sacrificial layer (not illustrated) can be formed and polished or etched back with the portions of the gate electrodes 1702 and 1722 and insulating layers. The heights of the gate electrodes 1702 and 1722 may be no greater than approximately 70%, no greater than approximately 50%, or no greater than approximately 40% of the gate electrodes 1702 and 1722 as initially formed. The reduced height of the stack can help to reduce elevational differences along the exposed surface of the workpiece. In the embodiment as illustrated, the insulating layer 1202 is exposed. In another embodiment, portions of the insulating layer 1402 may still overlie the insulating layer 1202 so that the insulating layer 1202 is not exposed. The sacrificial layer can be removed. In alternative embodiment, another insulating layer can be used instead of the sacrificial layer. The elevational differences can be reduced as previously described. Instead of removing the residual portions, as was done for the sacrificial layer, the residual portions of the other insulating layer may remain and be present in the finished electronic device.

Figure 28:
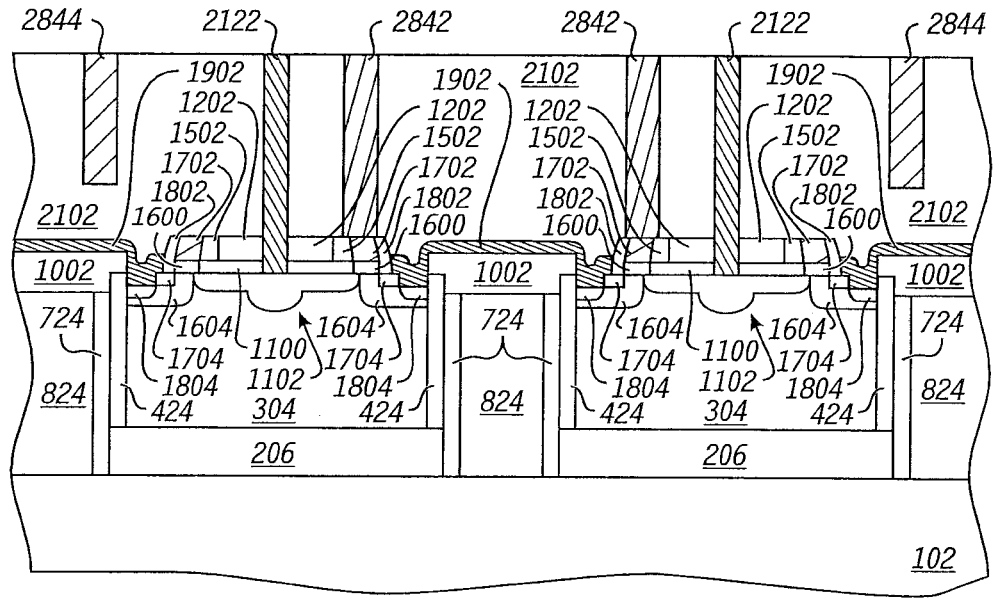
FIG. 28 includes an illustration of a cross-sectional view of the workpiece of FIG. 27 after forming an interlevel dielectric layer, conductive plugs, gate taps, and gate runners.
Figure 28:
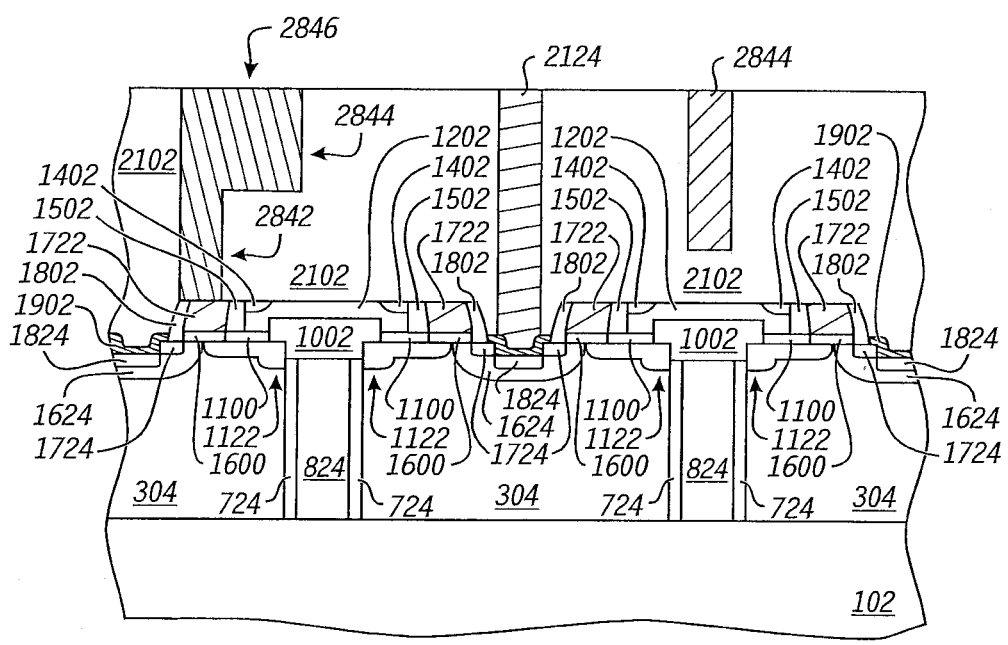

FIG. 28 includes an illustration after forming the ILD 2102, conductive plugs 2122 and 2124, gate taps 2842, and gate runners 2844. Patterning the ILD layer 2102 is different because the gate runners 2844 are formed to a shallower depth as compared to the conductive plugs 2122 and 2124, and gate taps 2842. The openings in the ILD layer 2102 for the gate runners 2844 can be formed separately from the openings for the conductive plugs 2122 and 2144 and the gate taps 2842. Otherwise, patterning the ILD layer 2102 and formation of the conductive plugs 2122 and 2124, gate taps 2842, and gate runners 2844 may be formed using any of the embodiments as previously described. Similarly, the shapes of the conductive plugs 2122 and 2124, gate taps 2842, and gate runners 2844 can use any of the embodiments as previously described with respect to FIGS. 23 and 24. As can be seen in FIG. 28, the conductive structure 2846 includes a portion corresponding to a gate tap 2842 and another portion corresponding to a gate runner 2844. After forming the conductive plugs 2122 and 2124, gate taps 2842, and gate runners 2844, processing can continue using any of the embodiments described with respect to FIG. 25.

In accordance with the concepts described herein, an electronic device can include gate electrodes with unlanded gate contacts. The unlanded gate contacts can be in the form of gate taps, which can be connected by gate runners. The gate runners allow routing of gate signals to the gate electrodes, and the layout of the gate runners can be designed to achieve a resistance or capacitance that is tuned for a particular circuit. In a particular embodiment, the gate electrodes can have a height such that overetching an insulating layer when defining contact openings can be performed without a significant risk of forming an electrical short or a leakage path to conductors that are not to be electrically connected to the gate electrodes. From a top view, the gate taps may be staggered with other contacts or vias at the same level without a significant risk of forming an electrical short or a leakage path between the gate taps and such other contacts or vias.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a source region, a drain region, a channel region between the source and drain regions, and a gate electrode overlying the channel region, wherein the gate electrode has a height that is greater than its width. The electronic device can further include a first gate tap including an unlanded contact to the gate electrode.

In an embodiment of the first aspect, the electronic device further includes a second gate tap contacting the gate electrode over the channel region, wherein the second gate tap is spaced apart from the first gate tap. In another embodiment, at a location where the first gate tap contacts the gate electrode, the first gate tap is wider than the gate electrode. In still another embodiment, the electronic device further includes a source contact electrically connected to the source region, wherein the source contact has a width that is narrower than the width of the gate tap; or a drain contact electrically connected to the drain region, wherein the drain contact has a width that is narrower than the width of the gate tap.

In a second aspect, an electronic device can include a source region, a drain region, a channel region between the source and drain regions, and a gate electrode overlying the channel region. The electronic device can further include gate taps spaced apart from each other, wherein at least some of the gate taps form unlanded contacts to the gate electrode.

In an embodiment of the second aspect, the electronic device further includes a gate runner that is electrically connected to the gate taps. In a particular embodiment, the gate runner has a width that is narrower than an averaged width of the gate taps. In another embodiment, the electronic device further includes a source contact electrically connected to the source region, wherein the source contact is disposed between the gate taps.

In a third aspect, an electronic device can include a source region, a drain region, a channel region between the source and drain regions, and a gate electrode overlying the channel region. The electronic device can further include a gate tap contacting the gate electrode, wherein, at a location where the gate tap contacts the gate electrode, the gate tap is wider than the gate electrode.

In an embodiment of the third aspect, the electronic device further includes a source contact electrically connected to the source region, wherein the source contact has a width that is narrower than the width of the gate tap; or a drain contact electrically connected to the drain region, wherein the drain contact has a width that is narrower than the width of the gate tap. In another embodiment, the electronic device further includes a gate runner, wherein the gate runner has a width that is less than a width of the gate tap. In a particular embodiment, the electronic device further includes a source contact electrically connected to the source region, wherein the source contact has a width that is approximately the same as the width of the gate runner; or a drain contact electrically connected to the drain region, wherein the drain contact has a width that is approximately the same as the width of the gate runner.

In a fourth aspect, a process of forming an electronic device can include forming a drift region of a drain region at a first time, forming a source region at a second time different from the first time, and forming a gate electrode. The process can further include forming a gate tap contacting the gate electrode over a channel region between the source and drain regions.

In an embodiment of the fourth aspect, the process further includes forming a gate runner that contacts the gate tap. In a particular embodiment, forming the gate tap and forming the gate runner are performed at substantially the same time. In another particular embodiment, the process further includes forming an insulating layer over the gate electrode, and patterning the insulating layer to define a gate tap opening overlying the gate electrode, patterning the insulating layer to define a gate runner trench. Forming the gate tap and forming the gate runner further includes depositing a conductive layer within the gate tap opening and within the gate runner trench; and removing a portion of the conductive layer overlying the insulating layer outside of the gate tap opening and the gate runner trench to form the gate tap and the gate runner. In a more particular embodiment, before depositing the conductive layer, the gate runner trench is shallower than the gate tap opening.

In a further embodiment, the process further includes forming an insulating layer over the drift region, and patterning the insulating layer to define a sidewall. Forming the gate electrode includes forming a conductive layer over the insulating layer and adjacent to the sidewall; and removing a portion of the conductive layer from over the insulating layer, wherein a remaining portion of the conductive layer is adjacent to the sidewall. In a particular embodiment, removing the portion of the conductive layer includes anisotropically etching the conductive layer to form a sidewall spacer, wherein the sidewall spacer is at least part of the gate electrode. In another particular embodiment forming the conductive layer fills an opening adjacent to the sidewall, and removing the portion of the conductive layer further includes recessing the gate electrode within the opening.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a source region;
   a drain region;
   a channel region between the source and drain regions;
   a gate electrode overlying the channel region; and
   a gate tap contacting the gate electrode, wherein, at a location where the gate tap contacts the gate electrode, the gate tap is wider than the gate electrode.

2. The electronic device of claim 1, further comprising:
   a source contact electrically connected to the source region, wherein the source contact has a width that is narrower than a width of the gate tap; or
   a drain contact electrically connected to the drain region, wherein the drain contact has a width that is narrower than the width of the gate tap.

3. The electronic device of claim 1, further comprising a gate runner, wherein the gate tap and the gate runner are parts of a monolithic structure.

4. The electronic device of claim 1, further comprising a gate runner, wherein the gate runner has a width that is less than a width of the gate tap.

5. The electronic device of claim 4, further comprising:
   a source contact electrically connected to the source region, wherein the source contact has a width that is approximately the same as the width of the gate runner; or
   a drain contact electrically connected to the drain region, wherein the drain contact has a width that is approximately the same as the width of the gate runner.

6. An electronic device comprising:
   a source region;
   a drain region;
   a channel region between the source and drain regions;
   a gate electrode overlying the channel region; and
   gate taps spaced apart from each other, wherein at least some of the gate taps form unlanded contacts to the gate electrode.

7. The electronic device of claim 6, further comprising a gate runner that is electrically connected to the gate taps.

8. The electronic device of claim 7, wherein the gate runner has a width that is narrower than an averaged width of the gate taps.

9. The electronic device of claim 6, further comprising a source contact electrically connected to the source region, wherein the source contact is disposed between the gate taps.

10. The electronic device of claim 7, wherein the at least some of the gate taps and the gate runner are parts of a monolithic structure.

11. An electronic device comprising:
    a source region;
    a drain region;
    a channel region between the source and drain regions;
    a gate electrode overlying the channel region;
    an insulating layer overlying the source region, the drain region, and the channel region, wherein the insulating layer defines a gate contact opening and a gate runner trench;
    a first gate tap contacting the gate electrode and lying within the gate contact opening; and
    a gate runner that is electrically connected to the gate electrode by the first gate tap, wherein the gate runner lies within the gate runner trench.

12. The electronic device of claim 11, wherein the gate contact opening and the gate runner trench are immediately adjacent to each other.

13. The electronic device of claim 11, wherein the gate contact opening has a first depth, and the gate runner trench has a second depth that is shallower than the first depth.

14. The electronic device of claim 11, wherein the first gate tap and the gate runner are parts of a monolithic structure.

15. The electronic device of claim 11, further comprising a second gate tap, wherein the second gate tap contacts the gate electrode at a location spaced apart from the first gate tap.

16. The electronic device of claim 15, wherein the first gate tap, the second gate tap, and the gate runner are parts of the monolithic structure.

17. The electronic device of claim 11, wherein, at a location where the first gate tap contacts the gate electrode, the first gate tap is wider than the gate electrode.

18. The electronic device of claim 17, further comprising:
- a source contact electrically connected to the source region, wherein the source contact has a width that is narrower than a width of the first gate tap; or
- a drain contact electrically connected to the drain region, wherein the drain contact has a width that is narrower than the width of the first gate tap.

19. The electronic device of claim 17, wherein the gate runner has a width that is less than a width of the first gate tap.

20. The electronic device of claim 19, further comprising:
- a source contact electrically connected to the source region, wherein the source contact has a width that is approximately the same as the width of the gate runner; or
- a drain contact electrically connected to the drain region, wherein the drain contact has a width that is approximately the same as the width of the gate runner.

* * * * *